(12) United States Patent
Ebihara

(10) Patent No.: US 12,733,539 B2
(45) Date of Patent: Sep. 8, 2026

(54) SEMICONDUCTOR DEVICE AND POWER CONVERTER

(71) Applicant: Mitsubishi Electric Corporation, Tokyo (JP)

(72) Inventor: Kohei Ebihara, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 378 days.

(21) Appl. No.: 18/291,598

(22) PCT Filed: Jul. 29, 2021

(86) PCT No.: PCT/JP2021/028085

§ 371 (c)(1), (2) Date: Jan. 24, 2024

(87) PCT Pub. No.: WO2023/007650

PCT Pub. Date: Feb. 2, 2023

(65) Prior Publication Data

US 2025/0112103 A1 Apr. 3, 2025

(51) Int. Cl.
*H10W 74/10* (2026.01)
*H02M 7/00* (2006.01)
(Continued)

(52) U.S. Cl.
CPC ......... *H10W 74/147* (2026.01); *H02M 7/003* (2013.01); *H02M 7/5387* (2013.01);
(Continued)

(58) Field of Classification Search
CPC . H10W 74/147; H10W 74/134; H10W 74/43; H02M 7/003; H02M 7/5387;
(Continued)

(56) References Cited

U.S. PATENT DOCUMENTS 5,552,625 A 9/1996 Murakami et al.
2012/0146055 A1* 6/2012 Mitani .................... H10D 8/60 257/77

(Continued)

FOREIGN PATENT DOCUMENTS

DE 69403251 T2 11/1997
DE 102020114276 A1 12/2020

(Continued)

OTHER PUBLICATIONS

International Search Report and Written Opinion mailed on Oct. 19, 2021, received for PCT Application PCT/JP2021/028085, filed on Jul. 29, 2021, 8 pages including English Translation.

(Continued)

*Primary Examiner* — J. E. Schoenholtz
(74) *Attorney, Agent, or Firm* — XSENSUS LLP

(57) ABSTRACT

A semiconductor device includes a field insulating film formed on an epitaxial layer, a front surface electrode riding onto an inner peripheral end of the field insulating film, and an outer peripheral electrode riding onto an outer peripheral end of the field insulating film. To a surface portion of the epitaxial layer, connected is the front surface electrode, and in the surface portion of the epitaxial layer, formed is a well region extending up to the outside of the outer peripheral end of the front surface electrode. A moisture-resistant insulating film is formed so as to cover the outer peripheral end of the front surface electrode, an inner peripheral end of the outer peripheral electrode, and the field insulating film. On the moisture-resistant insulating film, formed is a semi-insulating film connected to the front surface electrode and the outer peripheral electrode which are exposed from the moisture-resistant insulating film.

20 Claims, 17 Drawing Sheets

(51) Int. Cl.

| | |
|---|---|
| ***H02M 7/5387*** | (2007.01) |
| ***H10D 8/60*** | (2025.01) |
| ***H10D 30/66*** | (2025.01) |
| ***H10D 62/10*** | (2025.01) |
| ***H10D 62/832*** | (2025.01) |
| ***H10W 74/43*** | (2026.01) |

(52) U.S. Cl.
CPC ............. *H10D 8/60* (2025.01); *H10D 30/665* (2025.01); *H10D 62/106* (2025.01); *H10D 62/112* (2025.01); *H10W 74/134* (2026.01); *H10W 74/43* (2026.01); *H10D 62/8325* (2025.01)

(58) Field of Classification Search
CPC ...... H10D 8/60; H10D 30/665; H10D 62/106; H10D 62/112; H10D 62/8325; H10D 12/441; H10D 8/051; H10D 64/115; H10D 62/105
See application file for complete search history.

(56) References Cited

U.S. PATENT DOCUMENTS

| | | | | |
|---|---|---|---|---|
| 2017/0221998 | A1* | 8/2017 | Ebihara .................... | H10D 8/60 |
| 2019/0237549 | A1* | 8/2019 | Ebihara .................... | H10D 8/60 |
| 2019/0259867 | A1 | 8/2019 | Narita | |
| 2020/0295128 | A1 | 9/2020 | Minamikawa et al. | |

FOREIGN PATENT DOCUMENTS

| | | | |
|---|---|---|---|
| DE | 112018007915 | T5 | 4/2021 |
| JP | H06-268198 | A | 9/1994 |
| JP | H06-275852 | A | 9/1994 |
| JP | 2020-047718 | A | 3/2020 |
| JP | 2020-150157 | A | 9/2020 |

OTHER PUBLICATIONS

Office Action issued Feb. 26, 2026, in German Patent Application No. 112021008047.4, 16pp.

* cited by examiner

F I G. 2
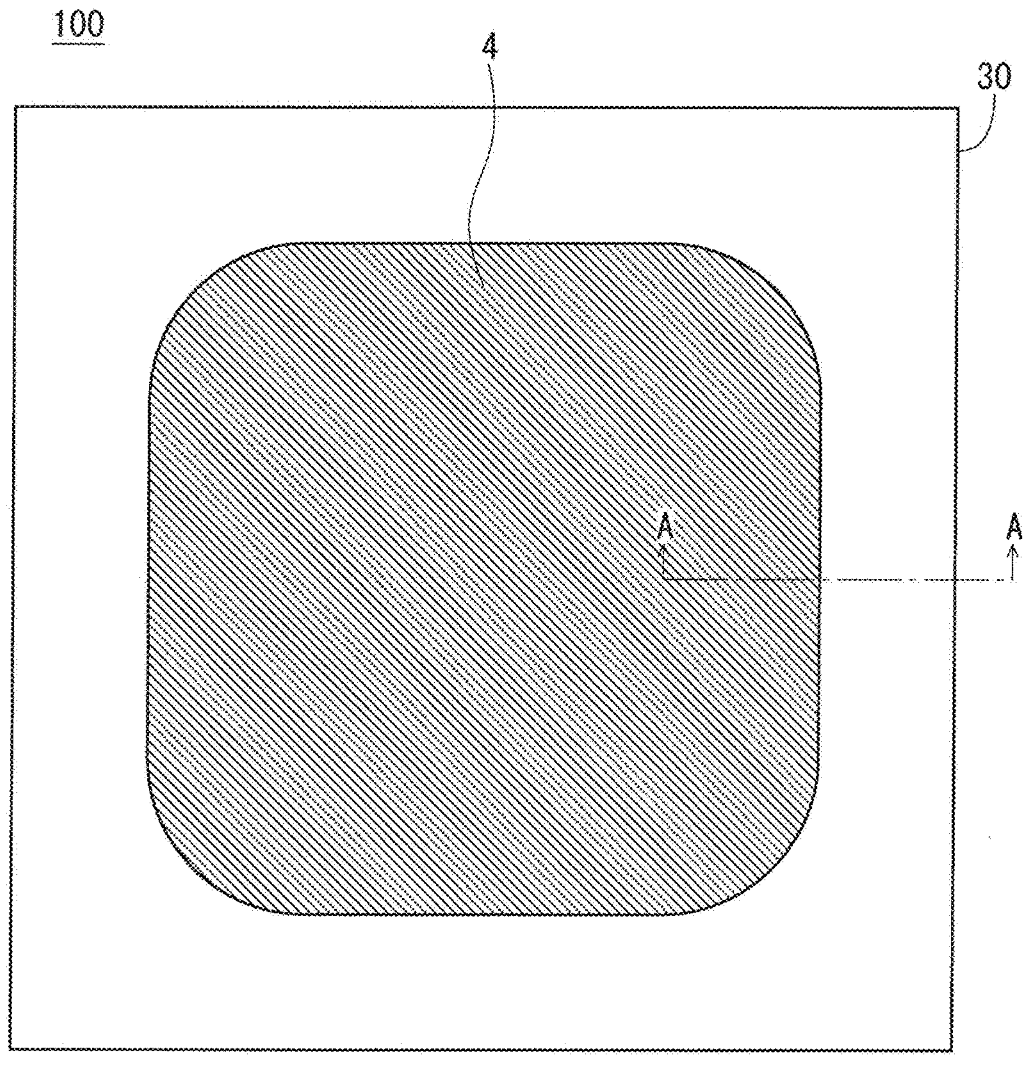

F I G. 3
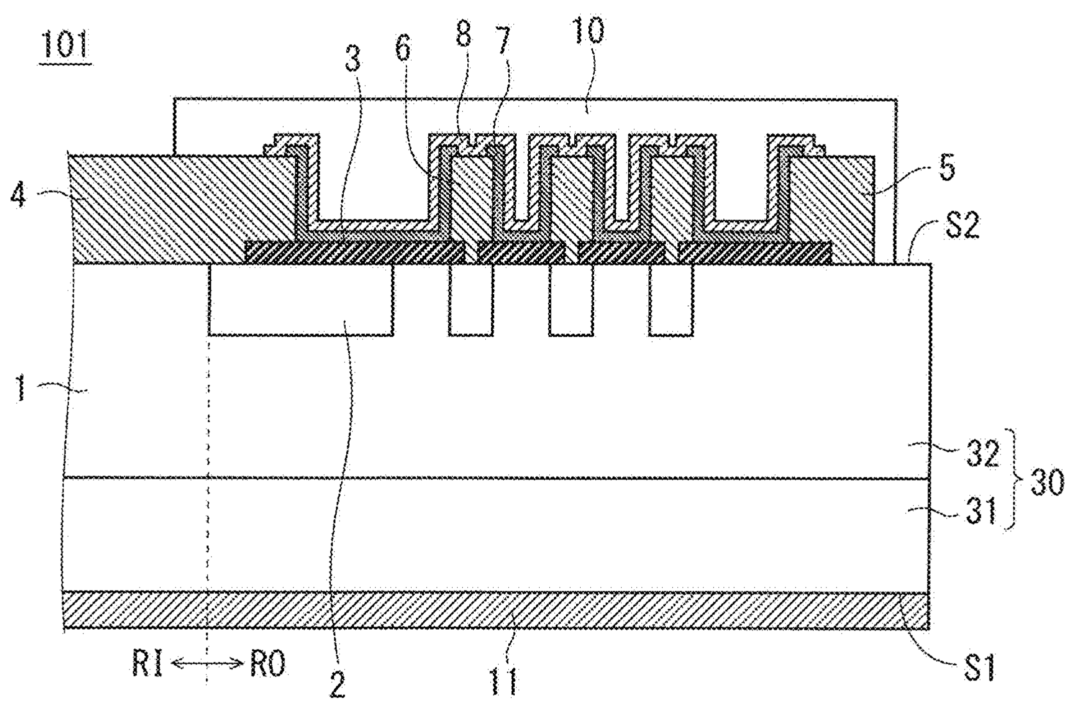

F I G. 5
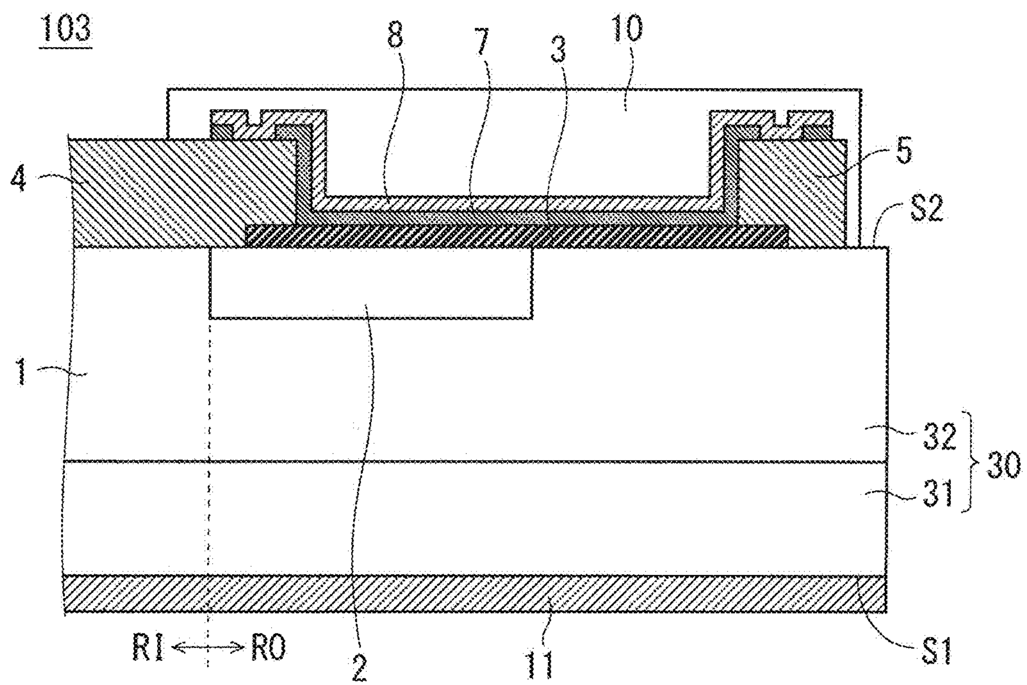

F I G. 6
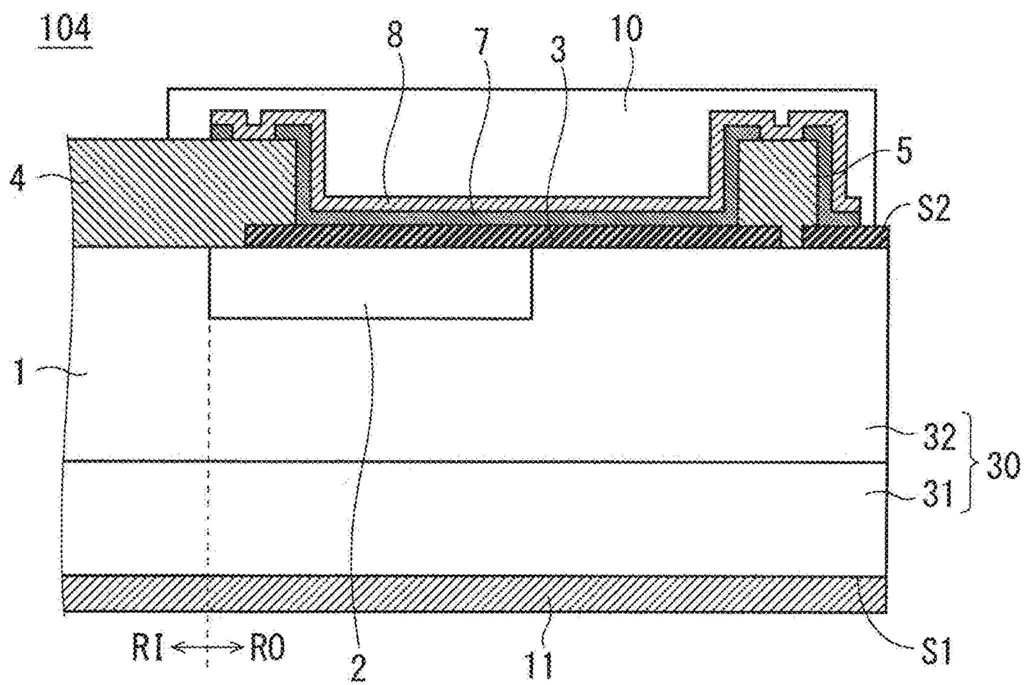

F I G. 7
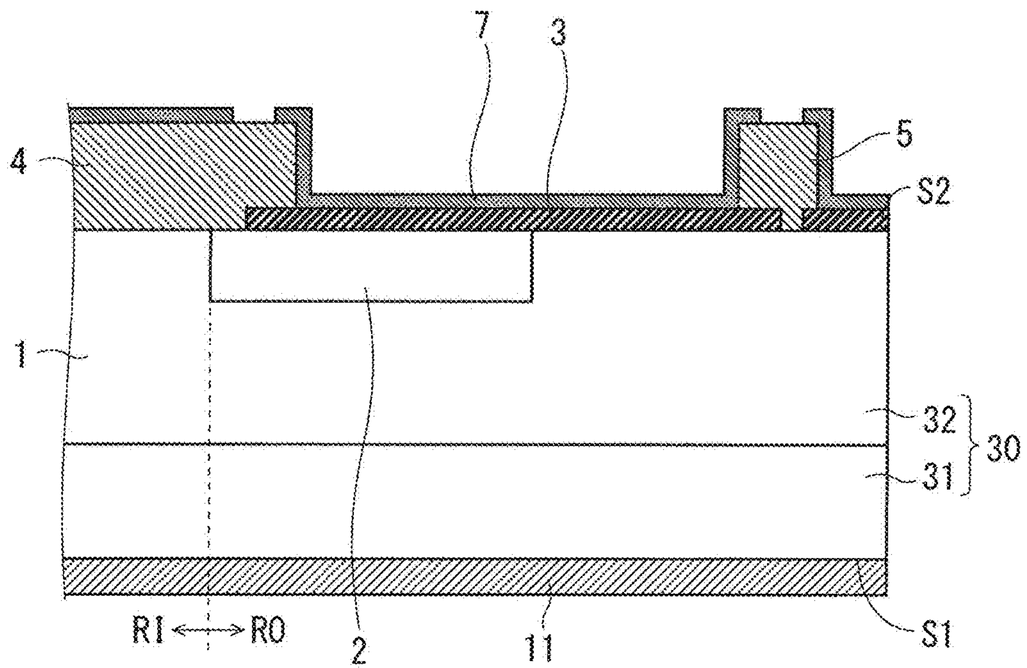

F I G. 8
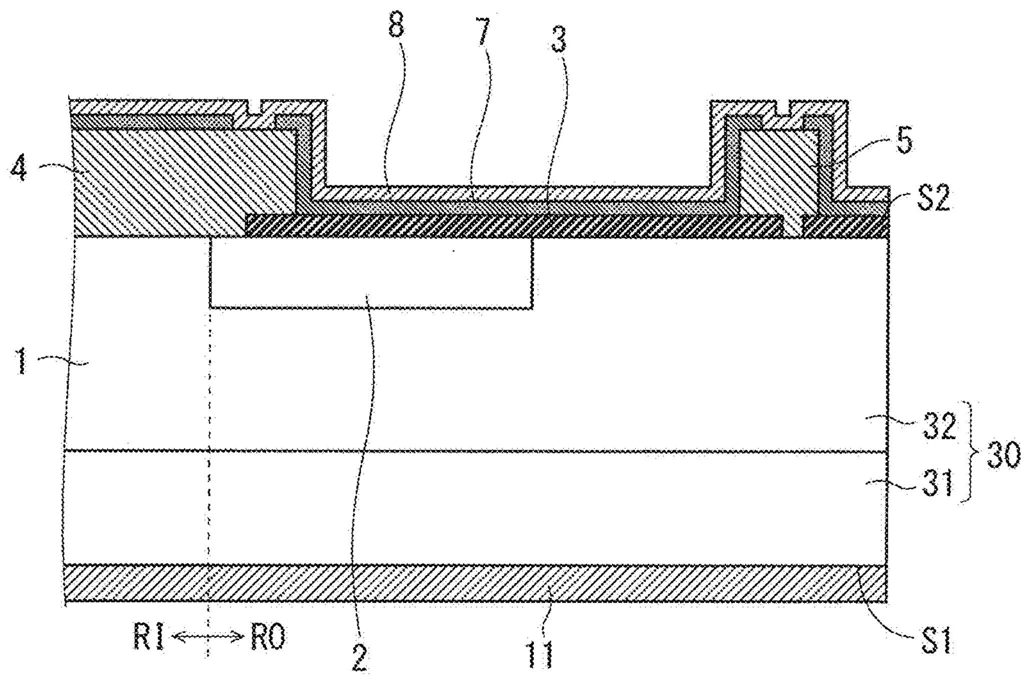

F I G. 15
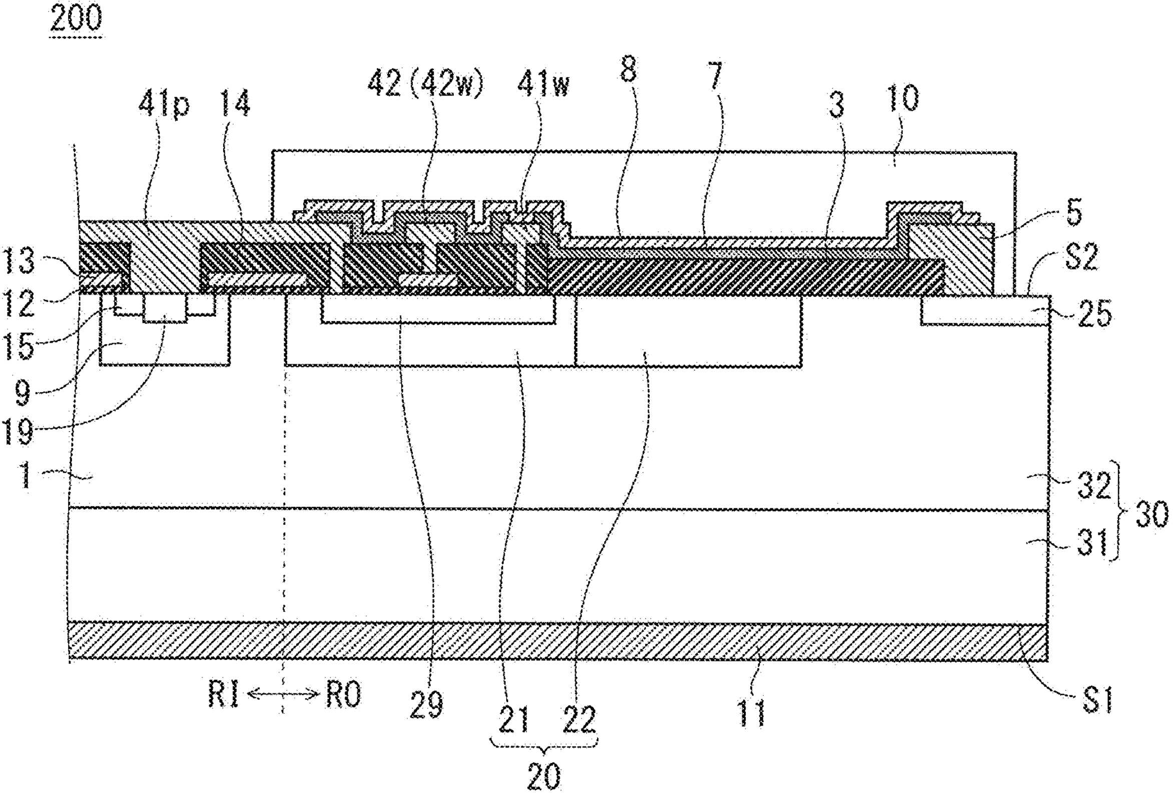

F I G. 1 6
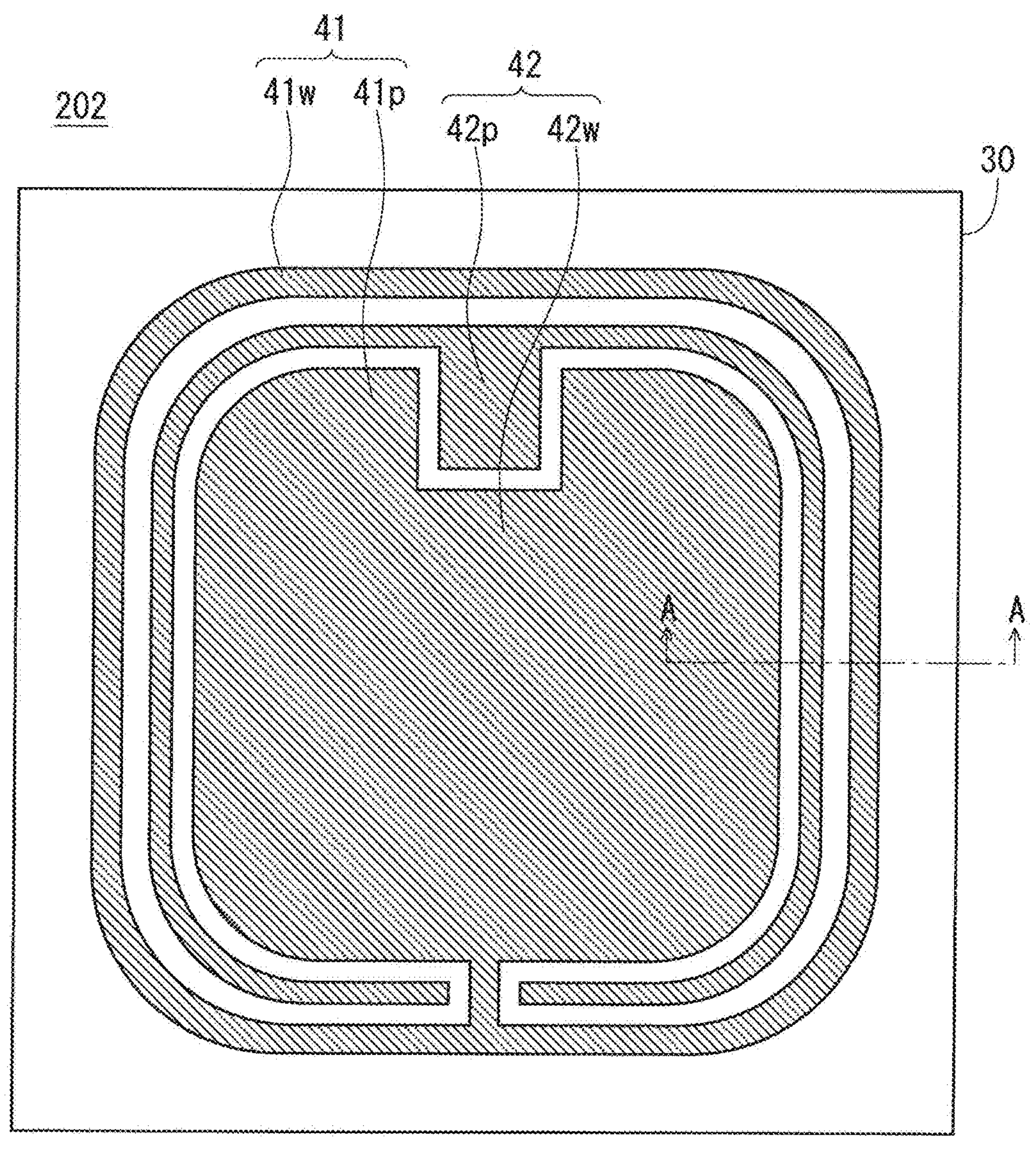

F I G. 1 7
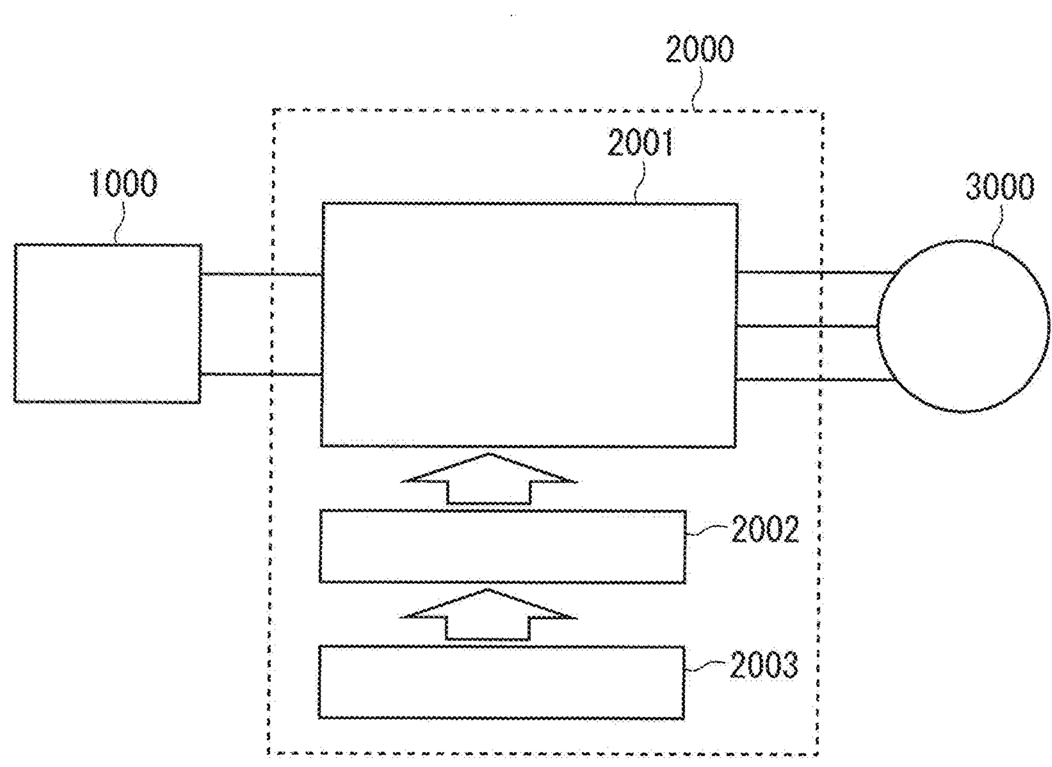

SEMICONDUCTOR DEVICE AND POWER CONVERTER

CROSS-REFERENCE TO RELATED APPLICATION

This application is a national stage application, pursuant to 35 U.S.C. § 371, of International Patent Application No. PCT/JP2021/028085, filed Jul. 29, 2021, the entire contents of which are incorporated herein by reference.

TECHNICAL FIELD

The present disclosure relates to a semiconductor device, and more particularly to a semiconductor device having a surface protection film.

BACKGROUND ART

In a vertical semiconductor device used for a power device or the like, a technique to ensure the withstand voltage performance is well known, in which a p-type guard ring region (terminal well region) is provided in a so-called terminal region at an outer peripheral portion of an n-type semiconductor layer. In the semiconductor device having a guard ring region, an electric field generated when a reverse voltage is applied to a main electrode of the semiconductor device is alleviated by a depletion layer formed by a pn junction between the n-type semiconductor layer and the p-type guard ring region.

Patent Document 1 shown below, for example, discloses a semiconductor device which has a structure including a semi-insulating film provided on an outer end portion of a p-type guard ring with an insulating film interposed therebetween and a front surface electrode connected to an end portion on an inner side of the semi-insulating film and an end portion on an outer side thereof, respectively. With this structure, a potential gradient in a terminal region of the semiconductor device is kept constant, and the electric field is thereby alleviated more effectively.

Further, the front surface electrode of the semiconductor device, except a region in which wire bonding is performed, is covered with polyimide serving as a surface protection film or sealed by using a sealing material such as gel or the like.

PRIOR ART DOCUMENTS

Patent Document(s)

[Patent Document 1] Japanese Patent Application Laid Open Gazette No. 6-275852

SUMMARY

Problem to be Solved by the Invention

The surface protection film such as polyimide or the like and the sealing material such as gel or the like are prone to contain moisture under high humidity conditions. There is a possibility that this moisture has an adverse effect on the front surface electrode. Specifically, in some cases, the front surface electrode is dissolved into the moisture, or the front surface electrode reacts with the moisture to thereby deposit an insulating material. In such a case, removal is prone to occur at an interface between the front surface electrode and the surface protection film or the sealing gel. There is a possibility that a cavity may be formed at an outer periphery of the front surface electrode by the removal of the surface protection film or the sealing gel, to act as a leak path and will damage the insulation reliability of the semiconductor device. Further, regardless of the presence or absence of the surface protection film, when an insulating material is deposited on the front surface electrode, there is a possibility that a stress may be applied to a material other than the front surface electrode, to damage the insulation reliability of the semiconductor device.

The present disclosure is intended to solve the above-described problem, and it is an object of the present disclosure to provide a semiconductor device having high insulation reliability.

Means to Solve the Problem

The present disclosure is intended for a semiconductor device, and the semiconductor device according to the present disclosure includes a semiconductor layer of a first conductivity type, a field insulating film formed on a surface of the semiconductor layer, a front surface electrode formed on the surface of the semiconductor layer on an inner side with respect to the field insulating film, riding onto an inner peripheral end of the field insulating film, an outer peripheral electrode formed on the surface of the semiconductor layer on an outer side with respect to the field insulating film, riding onto an outer peripheral end of the field insulating film, a well region of a second conductivity type formed in a surface portion of the semiconductor layer and connected to the front surface electrode, extending up to an outer side with respect to an outer peripheral end of the front surface electrode, a moisture-resistant insulating film which is formed so as to cover the outer peripheral end of the front surface electrode, an inner peripheral end of the outer peripheral electrode, and the field insulating film, a semi-insulating film formed on the moisture-resistant insulating film and connected to the front surface electrode and the outer peripheral electrode which are exposed from the moisture-resistant insulating film, and a back surface electrode formed on a back surface side of the semiconductor layer.

Effects of the Invention

According to the semiconductor device of the present disclosure, it is possible to prevent an insulating material from being deposited to a front surface electrode. This contributes to an increase in the insulation reliability of a semiconductor device.

These and other objects, features, aspects and advantages of the present disclosure will become more apparent from the following detailed description of the present disclosure when taken in conjunction with the accompanying drawings.

BRIEF DESCRIPTION OF DRAWINGS

FIG. 2 is a plan view showing the structure of the semiconductor device in accordance with the first preferred embodiment;

FIG. 3 is a partial cross section showing a structure of a semiconductor device in accordance with a first variation of the first preferred embodiment;

FIG. 5 is a partial cross section showing a structure of a semiconductor device in accordance with a third variation of the first preferred embodiment;

FIG. 6 is a partial cross section showing the structure of the semiconductor device in accordance with the third variation of the first preferred embodiment;

FIG. 7 is a partial cross section showing a manufacturing process of the semiconductor device in accordance with the first preferred embodiment;

FIG. 8 is a partial cross section showing the manufacturing process of the semiconductor device in accordance with the first preferred embodiment;

FIG. 15 is a partial cross section showing a structure of a semiconductor device in accordance with a second variation of the second preferred embodiment;

FIG. 16 is a plan view showing the structure of the semiconductor device in accordance with the second variation of the second preferred embodiment; and FIG. 17 is a block diagram showing a configuration of a power conversion system to which a power converter in accordance with a third preferred embodiment is applied.

DESCRIPTION OF EMBODIMENT(S)

Figure 1:
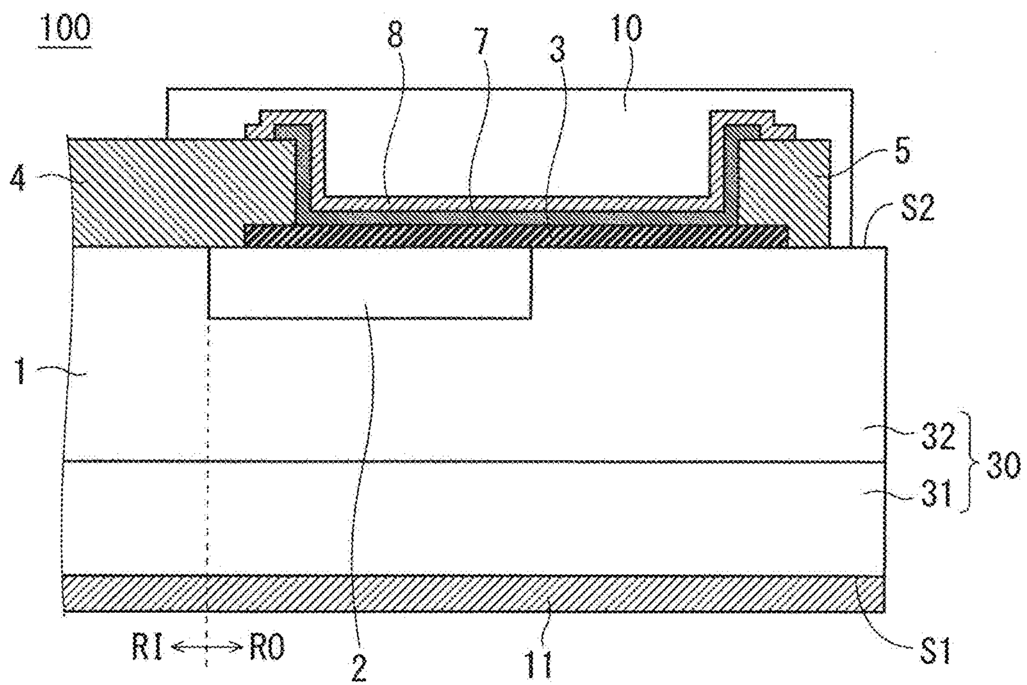
FIG. 1 is a partial cross section showing a structure of a semiconductor device in accordance with a first preferred embodiment.

Hereinafter, the preferred embodiments of a technique in accordance with the present disclosure will be described. In the present specification, an "active region" of a semiconductor device refers to a region in which a main current flows in an ON state of the semiconductor device, and a "terminal region" of the semiconductor device is defined as a region around the active region. Further, an "outer side" of the semiconductor device refers to a direction toward an outer peripheral portion from a center portion of the semiconductor device, and an "inner side" of the semiconductor device refers to the opposite direction of the "outer side". Furthermore, as to the conductivity type of an impurity, though it is assumed in the following description that a "first conductivity type" is n type and a "second conductivity type" is p type, it may be determined conversely that the "first conductivity type" is p type and the "second conductivity type" is n type.

Herein, the term "MOS" was used for representing a multilayer structure of "metal-oxide-semiconductor" in old times and it is said that the initials of "Metal-Oxide-Semiconductor" are adopted. Especially in a field effect transistor having the MOS structure (hereinafter, referred to simply as a "MOS transistor"), however, in terms of recent improvements in the integration and the manufacturing process, or the like, materials for a gate insulating film and a gate electrode are improved. In the MOS transistor, for example, mainly in terms of self-alignment formation of source and drain, polycrystalline silicon is adopted as the material of the gate electrode, instead of a metal. Further, in terms of an improvement in the electrical characteristics, a material having a high dielectric constant is used for the gate insulating film but the material is not necessarily limited to an oxide.

Therefore, the term "MOS" is not necessarily used limitedly for only the multilayer structure of metal-oxide-semiconductor, and the same applies to the present specification. In other words, in view of the common general technical knowledge, the term "MOS" is defined not only as an abbreviation of "Metal-Oxide-Semiconductor" but also as a term which widely includes a multilayer structure of conductor-insulator-semiconductor.

Further, in the following description, even when the expression of "on something" or "cover something" is used, it is inevitable that there is an inclusion between constituent elements. Even when it is described that "B is provided on A", "B covers A", or the like, for example, in some cases, any other constituent element is provided between A and B. Furthermore, in the following description, even in a case of using words such as "upper", "lower", "side", "bottom", "front", "back", and the like, which mean specific positions and directions, these words are used for the convenience of description and have no relation to the directions in the actual uses.

The following figures are schematically shown. For this reason, the size, the position, and the correlation of these are not necessarily represented accurately but may be changed as appropriate. Further, the correlation in the size and the position of constituent elements shown in different figures is also not necessarily represented accurately but may be changed as appropriate.

In each of the following figures, a constituent element having the same name and function as those of one shown in any other figure is represented by the same reference sign. Therefore, description of constituent elements identical to those described precedently with reference to any other figure will be sometimes omitted to avoid redundant description.

The First Preferred Embodiment

[Device Configuration]

FIG. 1 is a partial cross section showing a Schottky barrier diode (SBD) 100 which is a semiconductor device in accordance with the first preferred embodiment. FIG. 2 is a plan view showing the SBD 100, and an arrow cross section along the line A-A of FIG. 2 corresponds to FIG. 1. The left side portion of FIG. 1 shows an active region in which a main current flows in an ON state of the SBD 100, and the right side portion of FIG. 1 shows a terminal region which is a region on the outer side of the active region of the SBD 100. Hereinafter, the region which corresponds to the active region will be referred to as an "inner region RI", and the region which corresponds to the terminal region will be referred to as an "outer region RO".

As shown in FIG. 1, the SBD 100 is formed by using an epitaxial substrate 30 consisting of a single crystal substrate 31 and an epitaxial layer 32 formed thereon. The single crystal substrate 31 is a semiconductor substrate formed of n-type (first conductivity type) silicon carbide (SIC), and the epitaxial layer 32 is a semiconductor layer formed of SiC epitaxially grown on the single crystal substrate 31. In other words, the SBD 100 is a SiC-SBD. In the present preferred embodiment, used is the epitaxial substrate 30 of 4H polytype.

Herein, in FIG. 1, an upper side of the epitaxial substrate 30 is defined as a "front side" and a lower side thereof is defined as a "back side", and hereinafter, a main surface on the back side of the epitaxial substrate 30 will be referred to as a "back surface S1" and a main surface on the front side thereof will be referred to as a "front surface S2". Further, since the back surface S1 of the epitaxial substrate 30 is also a main surface of the single crystal substrate 31, this will be sometimes referred to as a "front surface S2 of the single crystal substrate 31". Similarly, since the front surface S2 of the epitaxial substrate 30 is also a main surface of the epitaxial layer 32, this will be sometimes referred to as a "front surface S2 of the epitaxial layer 32".

In a surface portion on the front side of the epitaxial layer 32 in the terminal region, a p-type (second conductivity type) terminal well region 2 is selectively formed. The terminal well region 2 is a frame-shaped (ring-shaped) region surrounding the active region in a plan view, and serves as a so-called guard ring. Further, as shown in FIG. 1, an end portion (also referred to as an "inner peripheral end") on an inner side of the terminal well region 2 is defined as a boundary between the inner region RI which is the active region and the outer region RO which is the terminal region.

An n-type region of the epitaxial layer 32, except the terminal well region 2, is a drift layer 1 in which currents are carried by drift. The impurity concentration of the drift layer 1 is lower than that of the single crystal substrate 31. For this reason, the single crystal substrate 31 has a resistivity lower than that of the drift layer 1. Herein, it is assumed that the impurity concentration of the drift layer 1 is not lower than $1\times10^{14}/cm^3$ and not higher than $1\times10^{17}/cm^3$.

The terminal well region 2 may include a plurality of regions having different impurity concentrations. Further, the number of terminal well regions 2 is not limited to one, and for example, a plurality of terminal well regions 2 which are separated from one another and arranged in a nested manner may be provided in the outer region RO. In other words, the terminal well region 2 may be divided into a plurality of terminal well regions 2.

On the front surface S2 of the epitaxial substrate 30, provided are a field insulating film 3, a front surface electrode 4, an outer peripheral electrode 5, a moisture-resistant insulating film 7, a semi-insulating film 8, and a surface protection film 10. Further, on the back surface S1 of the epitaxial substrate 30, provided is a back surface electrode 11. Furthermore, the plan view of FIG. 2 shows only the epitaxial substrate 30 and the front surface electrode 4 and the other constituent elements are not shown.

The field insulating film 3 covers part of the terminal well region 2 and extends up to an outer side of the terminal well region 2 beyond an end portion (also referred to as an "outer peripheral end") on the outer side of the terminal well region 2. The field insulating film 3, however, does not reach an outer peripheral end of the epitaxial substrate 30, and the front surface S2 of the epitaxial substrate 30 is exposed to an outer side of the field insulating film 3. Further, at a center portion of the field insulating film 3, an opening is formed to expose the front surface S2 of the active region of the epitaxial substrate 30.

The front surface electrode 4 is formed, lying astride the inner region R1 and the outer region RO, and connected to at least part of the front surface S2 of the epitaxial substrate 30. In the present preferred embodiment, the front surface electrode 4 is provided across the entire inner region R1 and connected to the terminal well region 2 in the outer region RO. The terminal well region 2 is connected to an outer peripheral portion of the front surface electrode 4 and extends up to an outer side with respect to an outer peripheral end of the front surface electrode 4. Further, the outer peripheral end of the front surface electrode 4 rides onto an inner peripheral end of the field insulating film 3.

A material of the front surface electrode 4 has only to be a metal which forms Schottky junction with the drift layer 1 which is an n-type SiC semiconductor, and for example, Ti (titanium), Mo (molybdenum), Ni (nickel), Au (gold), W (tungsten), or the like can be used. Further, the front surface electrode 4 may have a multilayer structure in which any one of metals such as Al (aluminum), Cu (copper), Mo, and Ni or an Al alloy such as Al—Si is layered on any one of the above-described materials.

The outer peripheral electrode 5 is provided on an outer side with respect to the terminal well region 2, being separated from the terminal well region 2, and connected to at least part of the front surface S2 of the outer region RO of the epitaxial substrate 30. In the present preferred embodiment, an inner peripheral end of the outer peripheral electrode 5 rides onto an outer peripheral end of the field insulating film 3.

As a material of the outer peripheral electrode 5, any one of metals such as Ti (titanium), Mo (molybdenum), Ni (nickel), Au (gold), W (tungsten), Al (aluminum), and Cu (copper) or the Al alloy such as Al—Si can be used. Further, the outer peripheral electrode 5 may have a multilayer structure consisting of two or more of these materials.

The moisture-resistant insulating film 7 is provided on at least part of the field insulating film 3 in the outer region RO. An inner peripheral end of the moisture-resistant insulating film 7 rides onto the outer peripheral end of the front surface electrode 4 and an outer peripheral end of the moisture-resistant insulating film 7 rides onto the inner peripheral end of the outer peripheral electrode 5. Therefore, an outer peripheral end surface of the front surface electrode 4 and an inner peripheral end surface of the outer peripheral electrode 5 are covered with the moisture-resistant insulating film 7. The moisture-resistant insulating film 7, however, does not cover the whole of the front surface electrode 4 and the outer peripheral electrode 5, and a portion of the front surface electrode 4 other than an outer peripheral portion and a portion of the outer peripheral electrode 5 other than an inner peripheral portion are exposed from the moisture-resistant insulating film 7.

As a material of the moisture-resistant insulating film 7, an insulating film having high moisture resistance, such as SiN, SiON, SiOC, or the like is used. In the present preferred embodiment, SiN is used as the material of the moisture-resistant insulating film 7, and the resistivity thereof is not lower than $1\times10^{12}$ Ω·cm. The film thickness of this SiN is not smaller than 100 nm and not larger than 2000 nm, preferably not smaller than 300 nm and not larger than 1500 nm, and more preferably not smaller than 500 mm and not larger than 1000 nm, and can be, for example, 500 nm.

The semi-insulating film 8 is formed of a semi-insulating (conductive) film (having relatively high resistivity) and provided so as to cover the moisture-resistant insulating film 7. Further, the semi-insulating film 8 is connected to the front surface electrode 4 exposed from the moisture-resistant insulating film 7 in a region on an inner side with respect to the moisture-resistant insulating film 7 and connected to the outer peripheral electrode 5 exposed from the moisture-resistant insulating film 7 in a region on an outer side with respect to the moisture-resistant insulating film 7.

As a material of the semi-insulating film 8, SInSiN (Semi-Insulated SiN), SIPOS (Semi-Insulated Polycrystalline Silicon), or the like can be used. In the present preferred embodiment, SInSiN is used as the material of the semi-insulating film 8 and the resistivity thereof is lower than $1\times10^{12}$ Ω·cm. Further, in the semi-insulating film 8, a lower layer portion which is in contact with the front surface electrode 4 and the outer peripheral electrode 5 has only to have semi-insulating properties. Therefore, the semi-insulating film 8 may have, for example, a multilayer structure in which a SiN film or the like having high moisture resistance is layered on a semi-insulating material.

The surface protection film 10 is formed on the semi-insulating film 8 and covers the outer peripheral end of the front surface electrode 4 and the outer peripheral electrode 5. A material of the surface protection film 10 is preferably an insulating resin material which can alleviate a stress, such as polyimide, polybenzoxazole, or the like. Further, in a case where the SBD 100 is used, being covered with a sealing gel having low elastic modulus such as silicone gel or the like, the surface protection film 10 is sometimes omitted.

In the inner region RI, openings are provided in the moisture-resistant insulating film 7, the semi-insulating film 8, and the surface protection film 10 to expose regions on which wire bonding or the like of the front surface electrode 4 is performed. Further, in the outer region RO, openings are provided in the moisture-resistant insulating film 7, the semi-insulating film 8, and the surface protection film 10 to expose regions on which dicing or the like of the epitaxial substrate 30 is performed.

Though FIG. 1 shows one cross section of a terminal portion of the SBD 100 in accordance with the first preferred embodiment (the cross section taken along the line A-A of FIG. 2), it is preferable that the SBD 100 should have the same cross-sectional structure as that of FIG. 1 along the entire circumference of the SBD 100. In other words, it is preferable that the moisture-resistant insulating film 7 should cover the entire circumference of the outer peripheral end of the front surface electrode 4 and the entire circumference of the inner peripheral end of the outer peripheral electrode 5 in a plan view.

In the present preferred embodiment, the material of the epitaxial substrate 30 is SiC. The SiC semiconductor has a wide bandgap wider than that of the Si semiconductor, and SiC semiconductor device has more excellent withstand voltage, higher allowable current density, and higher heat resistance as compared with the Si semiconductor device and can thereby perform a high temperature operation. The material of the epitaxial substrate 30, however, is not limited to SiC but may be Si or any other wide bandgap semiconductor such as gallium nitride (GaN) or the like.

Further, the semiconductor device in accordance with the present preferred embodiment may be a diode other than the SBD, such as a pn-junction diode or junction barrier Schottky (JBS) diode.

[The First Variation]

FIG. 3 is a cross section showing a structure of a SBD 101 in accordance with the first variation of the first preferred embodiment. In the SBD 101 shown in FIG. 3, the terminal well region 2 is divided into a plurality of terminal well regions. The field insulating film 3 has an opening above each of the plurality of terminal well regions 2. On the field insulating film 3, formed are a plurality of auxiliary electrodes 6 connected to the plurality of divided terminal well regions 2, respectively. The auxiliary electrode 6 is connected to the corresponding terminal well region 2 through the opening of the field insulating film 3. In other words, the plurality of auxiliary electrodes 6 are connected to the plurality of terminal well regions 2 and ride onto the field insulating film 3.

The moisture-resistant insulating film 7 is formed so as to cover the plurality of auxiliary electrodes 6 and has an opening above each of the plurality of auxiliary electrodes 6. The semi-insulating film & formed on the moisture-resistant insulating film 7 is connected to the plurality of auxiliary electrodes 6 through the openings of the moisture-resistant insulating film 7.

As a material of the auxiliary electrode 6, a metal containing any of Ti (titanium), Mo (molybdenum), Ni (nickel), Au (gold), W (tungsten), Al (aluminum), and Cu (copper), an Al alloy such as Al—Si (silicon), or the like can be used. The auxiliary electrode 6 may have a multilayer structure consisting of two or more of these materials.

[The Second Variation]

Figure 4:
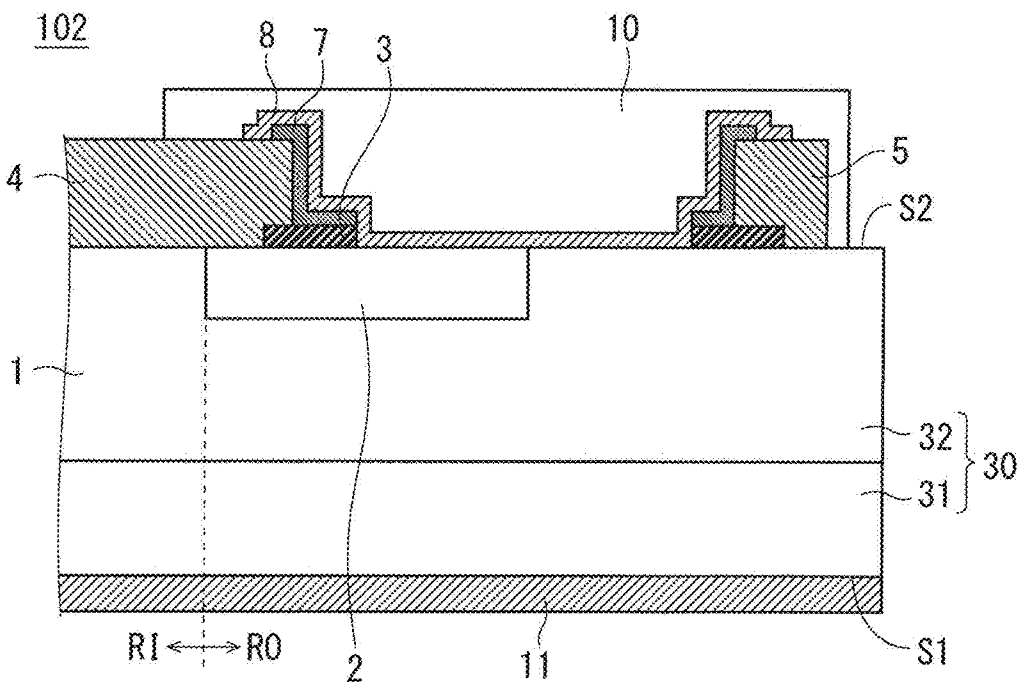
FIG. 4 is a partial cross section showing a structure of a semiconductor device in accordance with a second variation of the first preferred embodiment.

FIG. 4 is a cross section showing a structure of a SBD 102 in accordance with the second variation of the first preferred embodiment. In the SBD 102 shown in FIG. 4, the field insulating film 3 and the moisture-resistant insulating film 7 have an opening to expose the front surface S2 of the epitaxial substrate 30 including the terminal well region 2. The semi-insulating film 8 is connected to the epitaxial substrate 30 including the terminal well regions 2 through the openings.

[The Third Variation]

FIG. 5 is a cross section showing a structure of a SBD 103 in accordance with the third variation of the first preferred embodiment. In the SBD 103 shown in FIG. 5, the moisture-resistant insulating film 7 has an opening at a position different from an edge portion thereof, and the semi-insulating film 8 is connected to the front surface electrode 4 and the outer peripheral electrode 5 through the opening. In other words, the moisture-resistant insulating film 7 is provided with the opening to connect the semi-insulating film 8 to the front surface electrode 4 and the opening to connect the semi-insulating film 8 to the outer peripheral electrode S between the inner peripheral end and the outer peripheral end of the moisture-resistant insulating film 7.

In the present variation, the outer peripheral end of the moisture-resistant insulating film 7 may be positioned on the outer side with respect to the outer peripheral electrode 5. Specifically, like in a SBD 104 shown in FIG. 6, the moisture-resistant insulating film 7 may cover not only the inner peripheral end of the outer peripheral electrode 5 but also the outer peripheral end thereof. Further, the semi-insulating film 8 may also extends up onto the moisture-resistant insulating film 7 on the outer side with respect to the outer peripheral electrode 5.

[Operation]

Next, an operation of the SBD 100 of the first preferred embodiment described with reference to FIG. 1 will be described. When a negative voltage with the potential of the front surface electrode 4 as a reference is applied to the back surface electrode 11, the SBD 100 is brought into a state where currents flow from the front surface electrode 4 toward the back surface electrode 11, i.e., a conducting state (ON state), Conversely, when a positive voltage with the potential of the front surface electrode 4 as a reference is applied to the back surface electrode 11, the SBD 100 is brought into a blocking state (OFF state).

When the SBD 100 is in the OFF state, a large electric field is applied to a surface of an active region of the drift layer 1 and in the vicinity of a pn junction interface between the drift layer 1 and the terminal well region 2. The voltage applied to the back surface electrode 11 when this electric field reaches a critical electric field and avalanche breakdown occurs is defined as a maximum voltage (avalanche voltage). Normally, a rated voltage is determined so that the SBD 100 can be used in a voltage range in which the avalanche breakdown does not occur.

In the OFF state, a depletion layer is spread in a direction (downward direction) from the surface of the active region of the drift layer 1 and the pn junction interface between the drift layer 1 and the terminal well region 2 toward the single crystal substrate 31 and an outer peripheral direction (rightward direction) of the drift layer 1. Further, the depletion layer is spread from the pn junction interface between the drift layer 1 and the terminal well region 2 into the terminal well region 2, and the spreading manner thereof largely depends on the concentration of the terminal well region 2. Specifically, when the concentration of the terminal well region 2 becomes higher, the spread of the depletion layer in the terminal well region 2 is suppressed and a front end position of the depletion layer inside the terminal well region 2 is a position near the boundary between the terminal well region 2 and the drift layer 1.

Herein, considered is a case where the SBD 100 is brought into the OFF state under high humidity conditions. In a case where the surface protection film 10 is formed of polyimide or the like, the surface protection film 10 contains much moisture under high humidity conditions. When this moisture reaches the surfaces of the front surface electrode 4 and the outer peripheral electrode 5, the front surface electrode 4 acts as a cathode and the outer peripheral electrode 5 acts as an anode by the voltage applied to the SBD 100 in the OFF state. Also in a case where no surface protection film 10 is formed, much moisture permeates the sealing gel and reaches the SBD 100, and similarly the front surface electrode 4 acts as the cathode and the outer peripheral electrode 5 acts as the anode.

In the vicinity of the front surface electrode 4 acting as the cathode, as to the above-described moisture, a reduction reaction of oxygen expressed by the following chemical formula (1) and a production reaction of hydrogen expressed by the following chemical formula (2) occur.

$$O_2+2H_2O+4e^-\rightarrow 4OH^- \quad (1)$$

$$H_2O+e^-\rightarrow OH^-+\frac{1}{2}H_2 \quad (2)$$

With these reactions, the concentration of hydroxide ions in the vicinity of the front surface electrode 4 increases. The hydroxide ions chemically react with the front surface electrode 4. In a case where the front surface electrode 4 is formed of aluminum, for example, by the above-described chemical reactions, aluminum sometimes becomes aluminum hydroxide. Further, aluminum hydroxide sometimes becomes aluminum oxide, depending on the ambient temperature, pH, and the like Furthermore, in the case where the front surface electrode 4 is formed of aluminum, for example, in the vicinity of the outer peripheral electrode 5 acting as the anode, aluminum becomes $Al^{3+}$ and is dissolved, and then reacts with the ambient moisture to become aluminum hydroxide or aluminum oxide.

This aluminum hydroxide or aluminum oxide is deposited as the insulating material on the surfaces of the front surface electrode 4 and the outer peripheral electrode 5. With this deposition, when films on the front surface electrode 4 and the outer peripheral electrode S are broken or pushed up, to be thereby removed, and the removal develops to form a cavity portion in an upper portion of the field insulating film 3, moisture enters the cavity portion. This moisture entering the cavity portion causes excessive leakage currents or causes air discharge or the like in the cavity portion, and this can become a cause of element destruction of the SBD. Further, when volume expansion occurs by the deposition of the insulating material, a stress is applied to the field insulating film 3 and the epitaxial substrate 30 below the front surface electrode 4 and the outer peripheral electrode 5, to thereby cause physical destruction of the SBD 100, which can become a cause of element destruction.

The above-described deposition reaction of aluminum hydroxide or aluminum oxide is accelerated by the electric field strength. Especially, the outer peripheral end portion of the front surface electrode 4 and the inner peripheral end portion of the outer peripheral electrode 5 easily become a high electric field, and further in a case where the epitaxial substrate 30 is formed of silicon carbide, the drift layer 1 becomes a high concentration and therefore the electric field strength becomes much higher, and the deposition reaction of aluminum hydroxide or aluminum oxide is accelerated.

Further, the semiconductor device of above-described Patent Document 1 has a structure where the semi-insulating film 8 is connected to the outer peripheral end of the front surface electrode 4 and the inner peripheral end of the outer peripheral electrode 5, the moisture of the surface protection film 10 reaches the end portions of the front surface electrode 4 and the outer peripheral electrode 5 through the semi-insulating film & and electrons are exchanged between the front surface electrode 4 and the outer peripheral electrode 5 through the semi-insulating film 8, and the deposition reaction of aluminum hydroxide or aluminum oxide is thereby further accelerated. Furthermore, with the conductivity of the semi-insulating film 8, a potential gradient easily occurs around the outer peripheral end portion of the front surface electrode 4 and the inner peripheral end portion of the outer peripheral electrode 5 and there is a possibility that the deposition reaction of aluminum hydroxide or aluminum oxide may be accelerated by the electric field strength.

In contrast to this, in the SBD 100 of the first preferred embodiment, the moisture-resistant insulating film 7 covers an outer end surface of the front surface electrode 4 and an inner end surface of the outer peripheral electrode 5. It is thereby possible to prevent the moisture from reaching the outer peripheral end portion of the front surface electrode 4 and the inner peripheral end portion of the outer peripheral electrode 5 where aluminum hydroxide or aluminum oxide is especially easily deposited. As a result, it is possible to suppress deposition of aluminum hydroxide or aluminum oxide around the outer peripheral end portion of the front surface electrode 4 and the inner peripheral end portion of the outer peripheral electrode 5.

Further, in the SBD 100 of the first preferred embodiment, since the semi-insulating film 8 is connected to the front surface electrode 4 and the outer peripheral electrode 5 which are exposed from the moisture-resistant insulating film 7, a gentle potential gradient is formed from the front surface electrode 4 to the outer peripheral electrode 5. Therefore, it is possible to suppress occurrence of excessive electric field concentration around the terminal well region 2.

The above effects can be produced also in the SBDs 101 to 104 described in the first to third variations of the first preferred embodiment.

In the SBD 101 shown in FIG. 3, the inner peripheral end and the outer peripheral end of the auxiliary electrode 6 where the electric field is easily concentrated are covered with the moisture-resistant insulating film 7. For this reason, the moisture is hard to reach the inner peripheral end portion and the outer peripheral end portion of the auxiliary electrode 6, and it is thereby possible to suppress deposition of aluminum hydroxide or aluminum oxide. Further, since the semi-insulating film 8 is connected to the auxiliary electrode 6 through the opening portion of the moisture-resistant insulating film 7, the potentials of the plurality of terminal well regions 2 which are formed separately from one another are fixed and it is possible to more effectively alleviate the electric field concentration around the terminal well regions 2.

In the SBD 102 shown in FIG. 4, the semi-insulating film 8 is connected to the epitaxial substrate 30 including the terminal well regions 2. Since fixed electric charges generated when high electric field occurs around the terminal well region 2 are discharged through the semi-insulating film 8, it is possible to increase the reliability in application of high voltage to the semiconductor device.

In the SBD 103 shown in FIG. 5, the semi-insulating film 8 is connected to the front surface electrode 4 and the outer peripheral electrode 5 through the openings provided at the positions different from the edge portion of the moisture-resistant insulating film 7. In a case where the edge portion of the insulating film or the like is positioned on the surfaces of the front surface electrode 4 and the outer peripheral electrode 5, structurally, moisture is prone to stagnate and the deposition reaction of aluminum hydroxide or aluminum oxide easily occurs on the surfaces of the front surface electrode 4 and the outer peripheral electrode 5. Especially, when the edge portion of the semi-insulating film 8 is positioned on the surfaces of the front surface electrode 4 and the outer peripheral electrode 5, since electrons are exchanged between the front surface electrode 4 and the outer peripheral electrode 5 through the semi-insulating film 8, the deposition reaction of aluminum hydroxide or aluminum oxide on the surfaces of the front surface electrode 4 and the outer peripheral electrode 5 is accelerated. In the SBD 103, since the edge portion of the semi-insulating film 8 is away from the surfaces of the front surface electrode 4 and the outer peripheral electrode 5, it is possible to suppress the deposition reaction of aluminum hydroxide or aluminum oxide on the surfaces of the front surface electrode 4 and the outer peripheral electrode 5.

In the SBD 104 shown in FIG. 6, the moisture-resistant insulating film 7 covers both the inner end surface and the outer end surface of the outer peripheral electrode 5. It is thereby possible to suppress the deposition reaction of aluminum hydroxide or aluminum oxide in the entire surface of the outer peripheral electrode S. Further, the SBD 104 has a structure where in the region on the outer side with respect to the outer peripheral electrode 5, the moisture-resistant insulating film 7 and the semi-insulating film 8 ride onto the field insulating film 3. Therefore, since the region on the outer side with respect to the outer peripheral electrode 5, which can become an anode of the epitaxial substrate 30, is covered with the field insulating film 3 and the moisture-resistant insulating film 7, it is possible to suppress insulating material (insulator) deposition by anodization of the epitaxial substrate 30.

[Manufacturing Method]

Hereinafter, a method of manufacturing the SBD 100 in accordance with the first preferred embodiment will be described.

First, prepared is the single crystal substrate 31 having a low resistance which contains n-type impurities at a relatively high concentration ($n^+$). Herein, the single crystal substrate 31 is a SiC substrate of 4H polytype and has an off angle of 4 or 8 degrees.

Next, epitaxial growth of SiC is performed on the single crystal substrate 31, to thereby form the n-type epitaxial layer 32 having an impurity concentration not lower than $1\times10^{14}/cm^3$ and not higher than $1\times10^{17}/cm^3$. As a result, the epitaxial substrate 30 consisting of the single crystal substrate 31 and the epitaxial layer 32 is obtained.

Next, in a photolithography process, a resist mask having a predetermined pattern is formed on the epitaxial layer 32 and p-type impurity (acceptor) such as Al, B (boron), or the like are ion-implanted by using the resist mask as an implantation mask, to thereby form the p-type terminal well region 2 on an upper layer portion of the epitaxial layer 32. The dose amount in the terminal well region 2 is preferably not lower than $0.5\times10^{13}/cm^2$ and not higher than $5\times10^{13}/cm^2$, and for example, $1.0\times10^{13}/cm^2$.

In a case of using Al, the implantation energy of the ion implantation for forming the terminal well region 2 is, for example, not lower than 100 keV and not higher than 700 keV. In this case, the impurity concentration converted from the above-described dose amount [$cm^2$] is not lower than $1\times10^{17}/cm^3$ and not higher than $1\times10^{19}/cm^3$.

For forming the terminal well region 2, by patterning the resist mask so that a plurality of looped p-type impurity regions are formed in a nested manner, it is possible to form the plurality of divided terminal well regions 2 as shown in the SBD 101 of FIG. 3. Further, by repeating the patterning process of the resist mask and the ion implantation process, it is possible to form the terminal well region 2 constituted of a plurality of regions having different impurity concentrations.

After the formation of the terminal well region 2, annealing is performed by using a heat treatment apparatus at a temperature not lower than 1300° C. and not higher than 1900° C. in an atmosphere of an inert gas such as argon (Ar) gas or the like for not shorter than 30 seconds and not longer than 1 hour. By this annealing, the impurities added by the ion implantation are activated.

Next, for example, by the CVD method, a $SiO_2$ film having a thickness of 1 μm which is to become the field insulating film 3 is deposited on the front surface S2 of the epitaxial substrate 30. After that, in the photolithography process, a resist mask having a predetermined pattern is formed on the $SiO_2$ film and $SiO_2$ is etched by using the resist mask as an etching mask, to thereby form the field insulating film 3. By this etching, the $SiO_2$ film in a region where the front surface electrode 4 and the outer peripheral electrode 5 are in contact with the epitaxial substrate 30 is removed. Further, in a case of forming the SBD 101 of FIG. 3, the $SiO_2$ film in a region where the auxiliary electrode 6 is in contact with the epitaxial substrate 30 is also removed.

Next, on the epitaxial layer 32, for example, by the sputtering method, formed are, for example, a Ti film having a thickness of 10 nm and an Al film having a thickness of 3 μm in this order. After that, in the photolithography process, a resist mask having a predetermined pattern is formed on the Al film and RIE (Reactive Ion Etching) is performed on the Al film by using the resist mask as an etching mask, to thereby form the front surface electrode 4 and the outer peripheral electrode 5. In a case of forming the SBD 101 of FIG. 3, the auxiliary electrode 6 can be formed in this process.

Next, for example, by the plasma CVD method, a SiN film which is to become the moisture-resistant insulating film 7 is formed. At that time, the flow rate ratio of silane gas ($SiH_4$) and ammonia gas ($NH_3$) or nitrogen gas ($N_2$) which are raw materials of the SiN film, the film formation temperature, the power density, and the like, are adjusted so that the resistivity of the SiN film should be not lower than $1\times10^{12}$ Ω·cm. The resistivity of the SiN film is correlated with the refractive index, and the refractive index is not higher than about 2.2. After that, in the photolithography process, a resist mask having a predetermined pattern is formed on the SiN film and the SiN film is etched by using the resist mask as an etching mask, to thereby form the moisture-resistant insulating film 7. By this etching, the SiN film in a region where the semi-insulating film 8 and the front surface electrode 4 are connected to each other and that in a region where the semi-insulating film 8 and the outer peripheral electrode 5 are connected to each other are removed. Further, in a case of forming the SBD 101 of FIG. 3, the SiN film in a region where the semi-insulating film 8 and the auxiliary electrode 6 are connected to each other is also removed.

The SiN film which is to become the moisture-resistant insulating film 7 can be also formed by the thermal CVD method, and in this case, the SiN film stoichiometrically has a composition closer to $Si_3N_4$. The refractive index of $Si_3N_4$ is not lower than about 2.0 and not higher than about 2.1. For this reason, the SiN film formed by the thermal CVD method is a film having more excellent moisture resistance and insulating properties, but the film formation temperature of the thermal CVD method becomes much higher than that of the plasma CVD method. Therefore, in a case where a material containing Al is used as the material of the front surface electrode 4 or the like, the film formation temperature exceeds the melting point of Al and the SiN film cannot be formed by the thermal CVD method. In a case where the material of the front surface electrode 4 or the like is Cu or the like, not containing Al, the SiN film can be formed by the thermal CVD method.

Next, for example, by the plasma CVD method, a SinSiN film which is to become the semi-insulating film 8 is formed. At that time, the flow rate of silane gas (Silla) or the like which is a raw material is adjusted so that the resistivity of the SInSiN film should be lower than $1\times10^{12}$ Ω·cm. The resistivity of the SInSiN film is correlated with the refractive index and the refractive index is over about 2.2, but sometimes the bonding state in the film is changed and the refractive index thereby become not higher than 2.2, depending on the manufacturing method or the like. After that, in the photolithography process, a resist mask having a predetermined pattern is formed on the SInSiN film and the SInSiN film is etched by using the resist mask as an etching mask, to thereby form the semi-insulating film 8. By this etching, the SInSiN film in a region on which wire bonding, dicing, and the like are performed is removed.

In forming the material of the semi-insulating film 8, the semi-insulating film 8 may have a multilayer structure by forming a SiN film having high moisture resistance and insulating properties on the SInSiN film.

The SiN film and the SInSiN film can be etched in the same process. For this reason, in a case where the moisture-resistant insulating film 7 and the semi-insulating film 8 are formed of the SiN film and the SInSiN film, patterning of the moisture-resistant insulating film 7 and the semi-insulating film 8 may be performed in the following procedure.

First, the SiN film which is to become the moisture-resistant insulating film 7 is formed so as to cover the front surface electrode 4, the outer peripheral electrode 5, and the field insulating film 3, and as shown in FIG. 7, performed is a first etching process in which the SiN film in the region where the semi-insulating film 8 and the front surface electrode 4 are connected to each other and that in the region where the semi-insulating film 8 and the outer peripheral electrode 5 are connected to each other are removed, to thereby form openings in the moisture-resistant insulating film 7. In the first etching process, the SiN film in the region on which wire bonding, dicing, and the like are performed is left.

Figure 9:
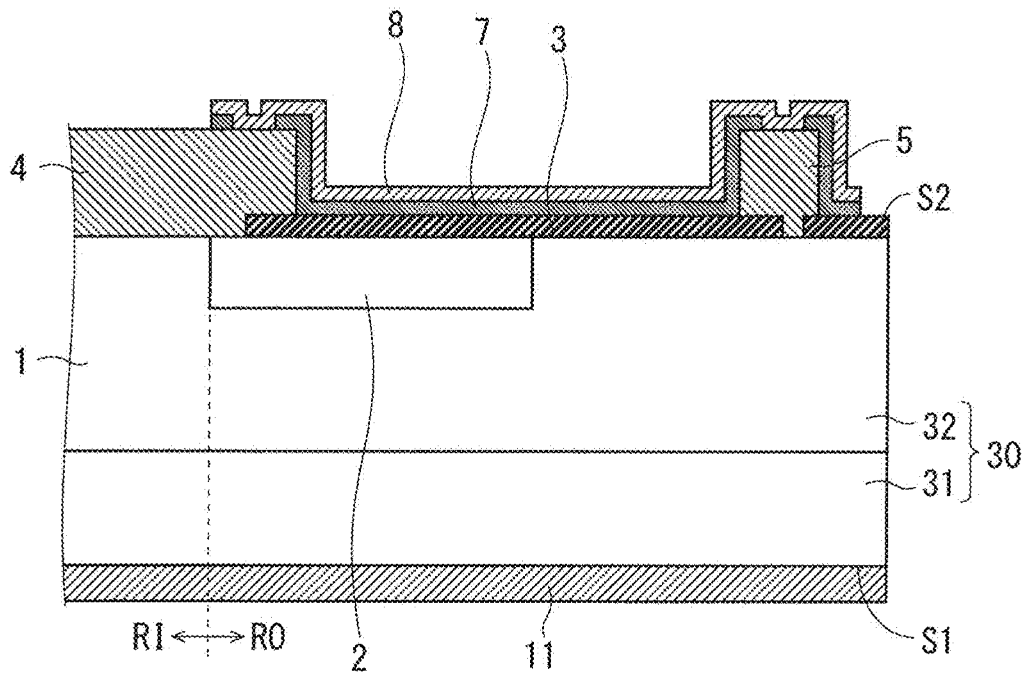
FIG. 9 is a partial cross section showing the manufacturing process of the semiconductor device in accordance with the first preferred embodiment.

After that, as shown in FIG. 8, the SInSiN film which is to become the semi-insulating film 8 is formed so as to cover the moisture-resistant insulating film 7. Then, by etching both the SiN film (moisture-resistant insulating film 7) and the semi-insulating film 8 (SInSiN film) by using the same etching mask, as shown in FIG. 9, performed is a second etching process in which the openings penetrating the moisture-resistant insulating film 7 and the semi-insulating film 8 are formed in the region on which wire bonding, dicing, and the like are performed. Part of the front surface electrode 4 is exposed in the opening in the region on which wire bonding is performed and the field insulating film 3 is exposed in the region on which dicing is performed.

By performing patterning of the moisture-resistant insulating film 7 and the semi-insulating film 8 in such a procedure, it is possible to reduce the number of times of overetching to the front surface electrode 4, the outer peripheral electrode 5, and the field insulating film 3 and suppress the damage to the front surface electrode 4, the outer peripheral electrode 5, and the field insulating film 3 due to the etching. By suppressing transformation of the surfaces of the front surface electrode 4 and the outer peripheral electrode 5 due to the overetching, expected is an effect of suppressing a state where deposition of the insulating material, or the like, is prone to occur from being caused.

Further, in the exemplary cases shown in FIGS. 7 to 9, the field insulating film 3 is also provided in a region on the outer side with respect to the outer peripheral electrode S, and it is thereby possible to suppress the damage to the epitaxial substrate 30 in performing etching of the SiN film and the SInSiN film.

Figure 10:
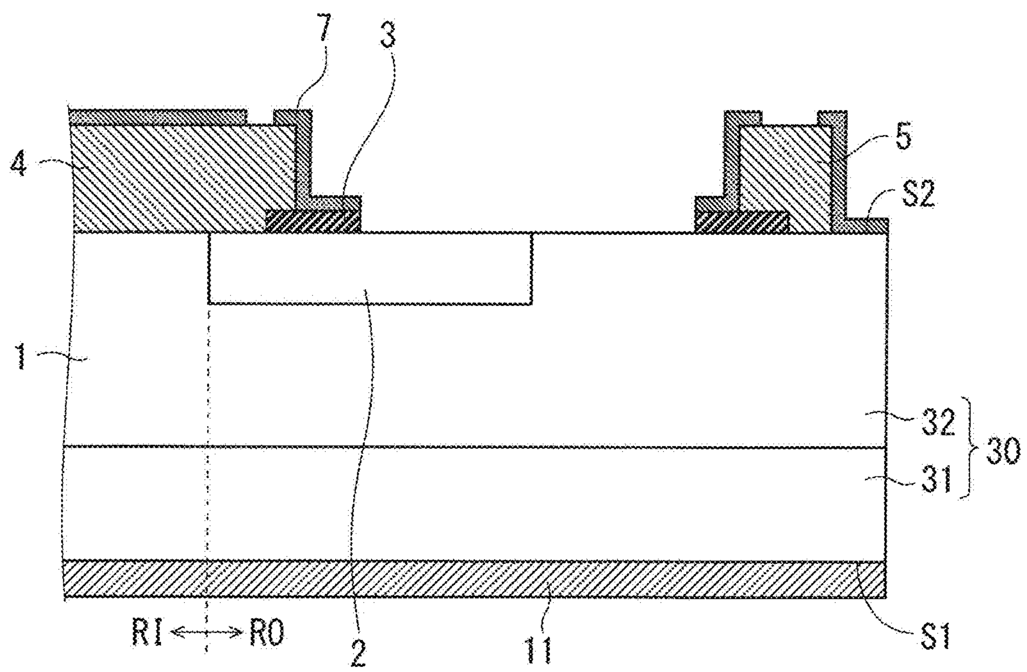
FIG. 10 is a partial cross section showing the manufacturing process of the semiconductor device in accordance with the first preferred embodiment.

Furthermore, the SiN film and the $SiO_2$ film can be etched in the same process. For this reason, in a case of forming the SBD 102 shown in FIG. 4, as shown in FIG. 10, in the etching for patterning of the SiN film of the moisture-resistant insulating film 7, the opening to connect the semi-insulating film 8 to the epitaxial substrate 30 including the terminal well region 2 may be formed in the field insulating film 3 formed of the $SiO_2$ film.

Further, this etching may be performed in the above-described first etching process. In other words, in the first etching process, an opening penetrating both the moisture-resistant insulating film 7 and the field insulating film 3, to expose part of the epitaxial layer 32, may be further formed.

After forming the moisture-resistant insulating film 7 and the semi-insulating film 8, for example, photosensitive polyimide is applied so as to cover the front surface electrode 4, the outer peripheral electrode 5, the field insulating film 3, the moisture-resistant insulating film 7, the semi-insulating film 8, and the front surface S2 of the epitaxial substrate 30, and the surface protection film 10 having a predetermined pattern is formed in the photolithography process. Further, in a case where the SBD 100 is used, being covered with the scaling gel having a low elastic modulus, such as silicone gel or the like, the formation of the surface protection film 10 may be omitted.

After that, for example, by the sputtering method, the back surface electrode 11 is formed on the back surface S1 of the epitaxial substrate 30, to thereby obtain the structure of the SBD 100 shown in FIG. 1.

Further, the formation of the back surface electrode 11 may be performed before or after the process of forming the front surface electrode 4 and the outer peripheral electrode 5. As a material of the back surface electrode 11, a metal containing one or more of Ti, Ni, Al, Cu, and Au, or the like can be used. The thickness of the back surface electrode 11 is preferably not smaller than 50 nm and not larger than 2 μm, and for example, the back surface electrode 11 may be formed of a double-layer film (Ti/Au) of Ti and Au each having a thickness not larger than 1 μm.

[Summary]

According to the first preferred embodiment and the variations thereof, it is possible to suppress the insulating material from being deposited to the outer peripheral end portion of the front surface electrode 4 and the inner peripheral end portion of the outer peripheral electrode 5. Further, the potential gradient in the terminal region becomes gentle and excessive electric field concentration is suppressed, and it is thereby possible to increase the insulation reliability of the SBD.

The Second Preferred Embodiment

[Device Configuration]

Figure 11:
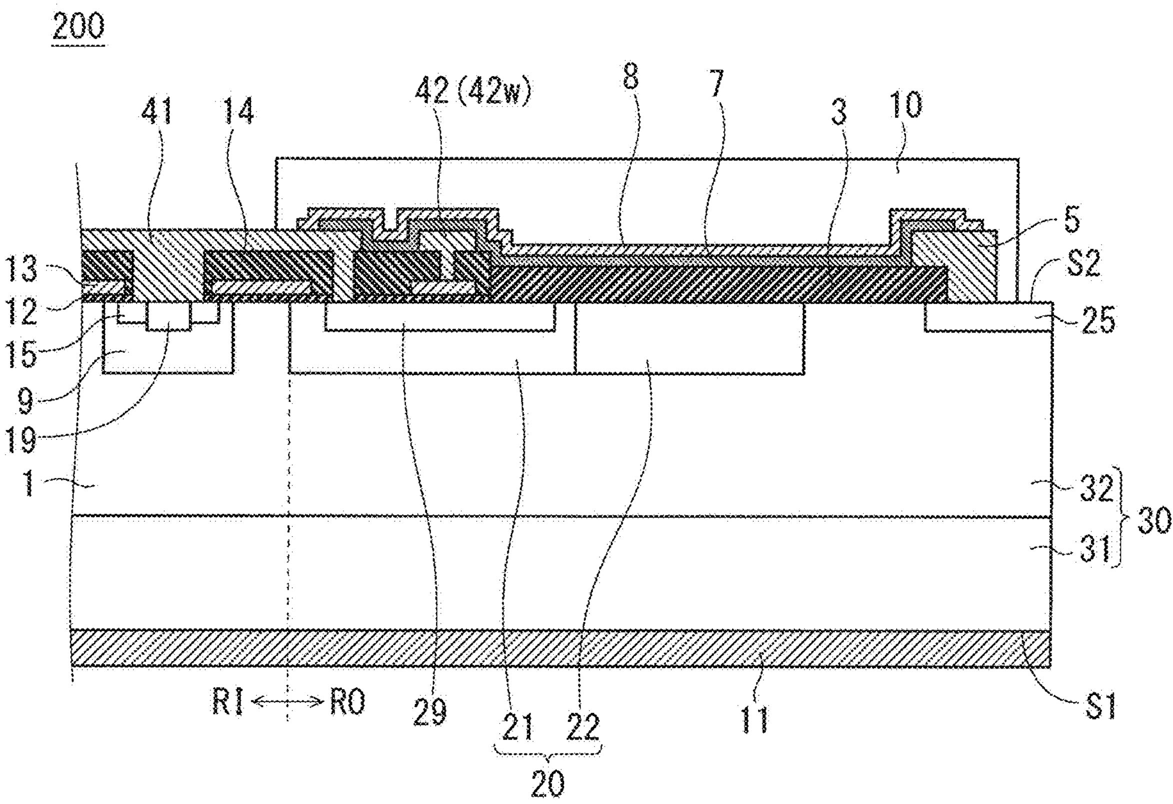
FIG. 11 is a partial cross section showing a structure of a semiconductor device in accordance with a second preferred embodiment.
Figure 12:
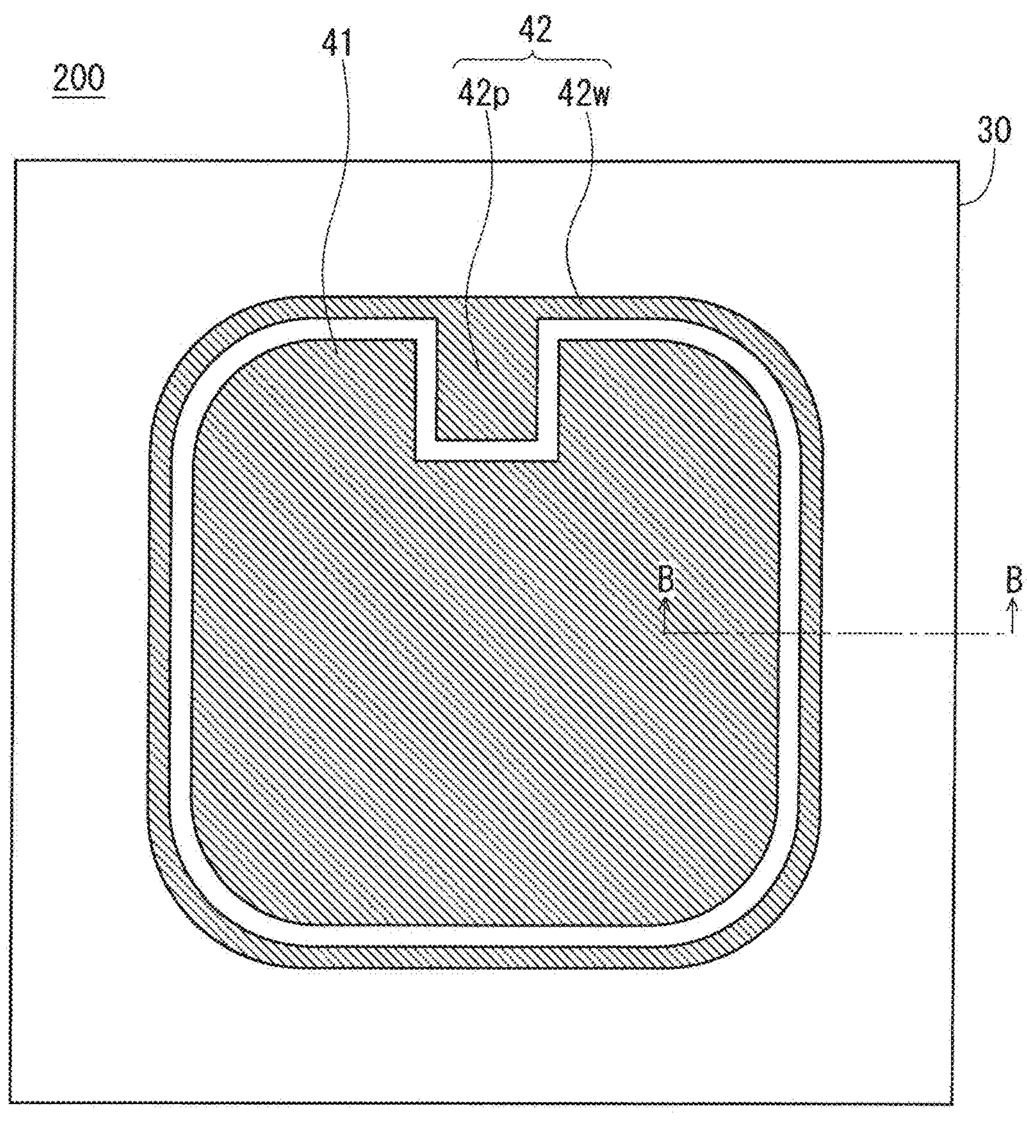
FIG. 12 is a plan view showing the structure of the semiconductor device in accordance with the second preferred embodiment.
Figure 13:
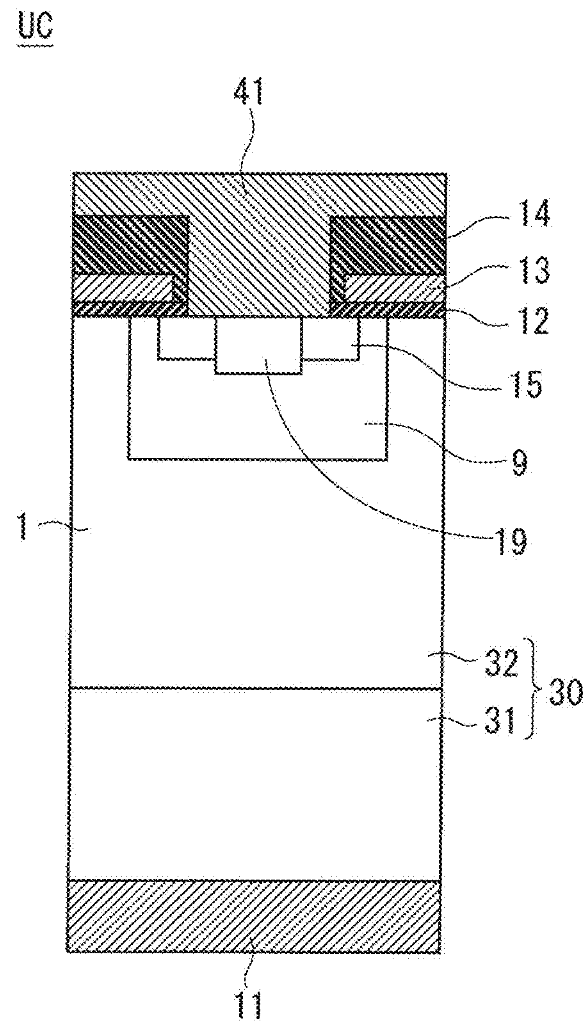
FIG. 13 is a partial cross section showing a structure of a unit cell of the semiconductor device in accordance with the second preferred embodiment.

FIG. 11 is a partial cross section showing a structure of a MOSFET 200 which is a semiconductor device in accordance with the second preferred embodiment. FIG. 12 is a plan view showing the MOSFET 200, and an arrow cross section along the line B-B of FIG. 12 corresponds to FIG. 11. FIG. 13 is a cross section showing a structure of a unit cell UC which is the minimum unit structure of the MOSFET formed in the inner region RI which is the active region. In the inner region RI of the MOSFET 200, a plurality of unit cells UC shown in FIG. 13 are arranged (at the left end portion of FIG. 11, the outermost peripheral unit cell UC is shown). Further, in FIGS. 11 to 13, since constituent elements having the same functions as those in the SBD 100 of the first preferred embodiment shown in FIGS. 1 and 2 are represented by the same reference signs, duplicate description of the first preferred embodiment will be omitted herein.

As shown in FIG. 11, the MOSFET 200 is formed by using the epitaxial substrate 30 consisting of the single crystal substrate 31 and the epitaxial layer 32 formed thereon. The single crystal substrate 31 is a semiconductor substrate formed of n-type (first conductivity type) silicon carbide (SIC), and the epitaxial layer 32 is a semiconductor layer formed of SiC epitaxially grown on the single crystal substrate 31. In other words, the MOSFET 200 is a SiC-MOSFET. In the present preferred embodiment, used is the epitaxial substrate 30 of 4H polytype.

In the surface portion on the front side of the epitaxial layer 32 in the active region, a p-type (second conductivity type) device well region 9 is selectively formed. Further, in a surface portion of the device well region 9, an n-type source region 15 and a p-type contact region 19 having a peak concentration of impurities higher than that of the device well region 9 are each selectively formed.

In the surface portion on the front side of the epitaxial layer 32 in the terminal region, a p-type terminal well region 20 is selectively formed so as to surround the active region. The terminal well region 20 includes a high concentration region 21 in contact with the boundary between the inner region RI and the outer region RO and a low concentration region 22 which extends outward from the high concentration region 21 so as to surround the high concentration region 21 and has a peak concentration of impurities lower than that of the high concentration region 21. Further, in a surface portion of the high concentration region 21, provided is a terminal contact region 29 having a peak concentration of impurities higher than that of the high concentration region 21. The conductivity type of the terminal contact region 29 may be n type. Furthermore, in a surface portion of an outer peripheral portion of the epitaxial layer 32, an n-type outer peripheral contact region 25 is formed. The conductivity type of the outer peripheral contact region 25 may be p type.

An n-type region of the epitaxial layer 32, except the above-described impurity region (the device well region 9, the source region 15, the contact region 19, the terminal well region 20, and the outer peripheral contact region 25), is the drift layer 1 in which currents are carried by drift. The impurity concentration of the drift layer 1 is lower than that of the single crystal substrate 31. For this reason, the single crystal substrate 31 has a resistivity lower than that of the drift layer 1. Herein, it is assumed that the impurity concentration of the drift layer 1 is not lower than $1\times10^{14}/cm^3$ and not higher than $1\times10^{17}/cm^3$.

The terminal well region 20 is a frame-shaped (ring-shaped) region surrounding the active region in a plan view, and serves as a so-called guard ring. Further, as shown in FIG. 11, with an end portion on an inner side (inner peripheral side) of the terminal well region 20 as a boundary, it is defined that the inner side with respect to the boundary is the inner region RI which is the active region and the outer side is the outer region RO which is the terminal region.

On the front surface S2 of the epitaxial substrate 30 in the active region, a gate insulating film 12 is formed so as to lie astride the source region 15, the device well region 9, and the drift layer 1, and a gate electrode 13 is formed thereon. The surface portion of the device well region 9 covered with the gate insulating film 12 and the gate electrode 13, i.e., a portion between the source region 15 and the drift layer 1 in the device well region 9 is a channel region in which an inversion channel is formed when the MOSFET 200 turns on.

In the active region, the gate electrode 13 is covered with an interlayer insulating film 14, and on the interlayer insulating film 14, formed is a source electrode 41 which is a front surface electrode. Therefore, the gate insulating film 12 and the gate electrode 13 are electrically isolated from each other by the interlayer insulating film 14. As shown in FIG. 12, the source electrode 41 is formed across the entire inner region RI.

The source electrode 41 is connected to the source region 15 and the contact region 19 through a contact hole formed in the interlayer insulating film 14. The interlayer insulating film 14 and the contact region 19 form an ohmic contact. Further, on the back surface S1 of the epitaxial substrate 30, the back surface electrode 11 serving as a drain electrode is formed.

As shown in FIG. 11, part of the gate insulating film 12, the gate electrode 13, the interlayer insulating film 14, and the source electrode 41 extend up to the outer region RO beyond the boundary between the inner region RI and the outer region RO. The source electrode 41 drawn to the outer region RO is connected to the terminal contact region 29 in the terminal well region 20 so as to form an ohmic contact or a Schottky contact therewith through the contact hole formed in the interlayer insulating film 14. Further, the gate electrode 13 drawn to the outer region RO is provided on the high concentration region 21 of the terminal well region 20 with the gate insulating film 12 interposed therebetween and extends in a frame-like manner in a plan view like the high concentration region 21.

To the gate electrode 13 drawn to the outer region RO, a gate wiring electrode 42 formed on the interlayer insulating film 14 is connected through an opening provided in the interlayer insulating film 14. The gate wiring electrode 42 is a control wiring electrode used for receiving a gate signal (control signal) to control an electrical path between the source electrode 41 and the back surface electrode 11 which is a drain electrode and is provided separately from the source electrode 41 and electrically isolated from the source electrode 41.

As shown in FIG. 12, the gate wiring electrode 42 includes a gate wiring 42 which is provided so as to surround the source electrode 41 and a gate pad 42*p* on which wire bonding is performed. In the present preferred embodiment, the source electrode 41 has a rectangular shape in a plan view, and the gate pad 42*p* is provided so as to enter a recessed portion formed on one side of the rectangular source electrode 41. The gate wiring electrode 42 shown in FIG. 11 corresponds to the gate wiring 42*w*. Further, in the plan view of FIG. 12, only the epitaxial substrate 30, the source electrode 41, and the gate wiring electrode 42 are shown and the other constituent elements are not shown.

Though the gate wiring 42*w* and the gate pad 42*p* are directly connected to each other in FIG. 12, there may be a structure where the gate wiring 42*w* and the gate pad 42*p* are separated from each other and electrically connected to each other through the gate electrode 13 below the interlayer insulating film 14.

The field insulating film 3 is provided on the front surface S2 of the outer region RO of the epitaxial substrate 30, and covers part of the high concentration region 21 and the entire low concentration region 22 and extends up to the vicinity of the edge portion of the epitaxial substrate 30. The field insulating film 3 is not provided in the inner region RI. In other words, the field insulating film 3 is provided with an opening including the inner region RI on the whole.

Though the inner peripheral end of the field insulating film 3 is connected to a side surface of the interlayer insulating film 14 in FIG. 11, an outer peripheral end of the interlayer insulating film 14 may ride onto the inner peripheral end of the field insulating film 3. Further, the field insulating film 3 and the interlayer insulating film 14 may be formed at the same time to be an integral film.

The outer peripheral electrode 5 is provided on the front surface S2 of the epitaxial substrate 30, separately from the terminal well region 20, and connected to at least part of a surface of the outer peripheral contact region 25. The inner peripheral end of the outer peripheral electrode 5 rides onto the outer peripheral end of the field insulating film 3.

The moisture-resistant insulating film 7 is provided on at least part of the field insulating film 3 in the outer region RO and covers an outer peripheral end of the source electrode 41, the inner peripheral end of the outer peripheral electrode 5, and an inner peripheral end and an outer peripheral end of the gate wiring electrode 42. The moisture-resistant insulating film 7 is provided with openings above the source electrode 41, the outer peripheral electrode 5, and the gate wiring electrode 42. The opening portion above the gate wiring electrode 42, however, is provided on the gate pad 42*p* which is not shown in FIG. 11 and the gate wiring 42*w* is completely covered with the moisture-resistant insulating film 7.

The semi-insulating film 8 is formed so as to cover the moisture-resistant insulating film 7 and is connected to the source electrode 41 and the outer peripheral electrode 5 which are exposed from the moisture-resistant insulating film 7. The semi-insulating film 8 is not connected to the gate pad 42*p*.

The surface protection film 10 is formed so as to cover the outer peripheral end of the source electrode 41, the inner peripheral end and the outer peripheral end of the gate wiring electrode 42, and the outer peripheral electrode 5. The surface protection film 10 is provided with openings above the source electrode 41 and the gate pad 42*p*. Further, in a case where the MOSFET 200 is used being covered with the sealing gel having a low elastic modulus, such as silicone gel or the like, the surface protection film 10 is sometimes omitted.

The moisture-resistant insulating film 7, the semi-insulating film 8, and the surface protection film 10 have openings in a region on the source electrode 41 and the gate pad 42*p*, on which wire bonding or the like is performed, and a region on the epitaxial substrate 30, on which dicing or the like is performed.

Though FIG. 11 shows one cross section of a terminal portion of the MOSFET 200 in accordance with the second preferred embodiment (the cross section taken along the line B-B of FIG. 12), it is preferable that the MOSFET 200 should have the same cross-sectional structure as that of FIG. 11 at all the positions in a portion where the gate wiring 42*w* in the terminal portion of the MOSFET 200 extends. Further, it is preferable that the MOSFET 200 should have a structure in which the moisture-resistant insulating film 7 covers the inner peripheral end and the outer peripheral end of the gate pad 42*p* at all the positions in a portion where the gate pad 42*p* is provided. In other words, it is preferable that the moisture-resistant insulating film 7 should cover the entire circumference of the outer peripheral end of the source electrode 41, the entire circumference of the inner peripheral end of the outer peripheral electrode 5, and the entire circumference of the inner peripheral end and the outer peripheral end of the gate wiring electrode 42 in a plan view. Further, it is preferable that the moisture-resistant insulating film 7 should cover the inner peripheral end and the outer peripheral end of the gate wiring 42*w* in a plan view.

Furthermore, the present preferred embodiment has been described, assuming that the epitaxial substrate 30 is formed of SiC. SiC has a wide bandgap wider than that of Si, and the SiC semiconductor device using SIC has more excellent withstand voltage, higher allowable current density, and higher heat resistance as compared with the Si semiconductor device using Si and can thereby perform a high temperature operation. The material of the epitaxial substrate 30, however, is not limited to SiC but may be any other wide bandgap semiconductor such as gallium nitride (GaN). Further, instead of the wide bandgap semiconductor, for example, silicon (Si) may be used. Furthermore, the semiconductor device may be a transistor other than the MOSFET, and may be, for example, a JFET (Junction FET) or an IGBT (Insulated Gate Bipolar Transistor).

[The First Variation]

Figure 14:
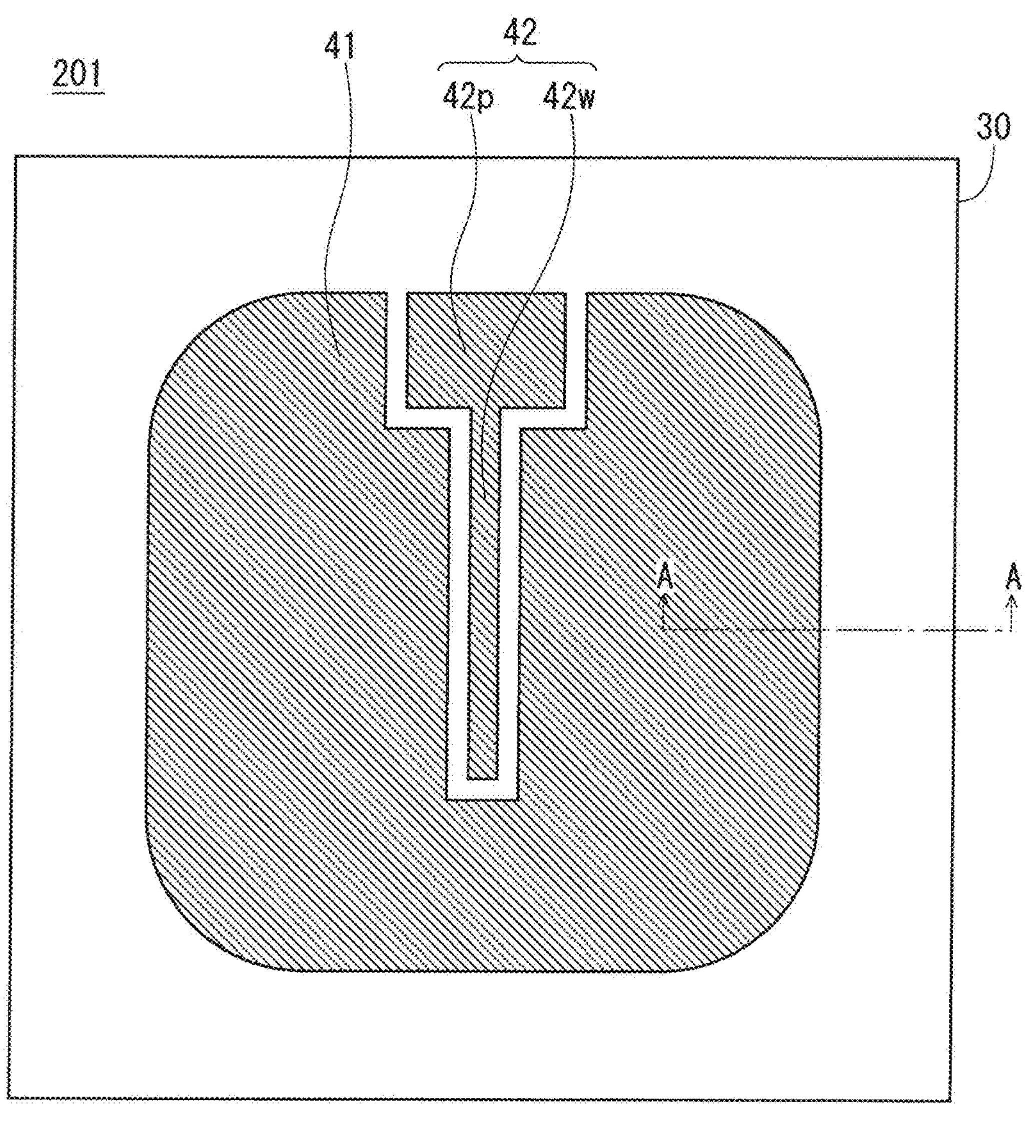
FIG. 14 is a plan view showing a structure of a semiconductor device in accordance with a first variation of the second preferred embodiment.

FIG. 14 is a plan view showing a structure of a MOSFET 201 in accordance with the first variation of the second preferred embodiment. FIG. 14 shows only the source electrode 41 and the gate wiring electrode 42 among an upper surface structure of the MOSFET 201, for convenience. The MOSFET 201 shown in FIG. 14 is different from the MOSFET 200 shown in FIG. 12 in that the gate wiring 42*w* does not surround the source electrode 41 and is formed so as to enter a recessed portion which is deeply formed on one side of the rectangular source electrode 41 in a plan view.

Also in the MOSFET 201, the moisture-resistant insulating film 7 covers the outer side end of the source electrode 41, the inner side end of the outer peripheral electrode 5, and the inner peripheral end and the outer peripheral end of the gate wiring electrode 42, rides onto the source electrode 41, the outer peripheral electrode 5, and the gate wiring electrode 42, and has openings above the source electrode 41, the outer peripheral electrode 5, and the gate wiring electrode 42. Further, the moisture-resistant insulating film 7 completely covers the gate wiring 42*w*, and the opening portion above the gate wiring electrode 42 is provided on the gate pad 42*p*.

Furthermore, the semi-insulating film 8 is formed so as to cover the moisture-resistant insulating film 7 and is connected to the source electrode 41 and the outer peripheral electrode 5 which are exposed from the moisture-resistant insulating film 7. Further, the semi-insulating film 8 is not connected to the gate wiring electrode 42.

[The Second Variation]

FIG. 15 is a partial cross section showing a structure of a MOSFET 202 in accordance with the second variation of the second preferred embodiment, and FIG. 16 is a plan view showing the structure of the MOSFET 202. Further, an arrow cross section along the line C-C of FIG. 16 corresponds to FIG. 15. FIG. 16 shows only the source electrode 41 and the gate wiring electrode 42 among an upper surface structure of the MOSFET 202, for convenience.

In the MOSFET 202 shown in FIG. 16, the source electrode 41 includes a source pad 41*p* having a rectangular shape in a plan view and a source wiring 41*w* which is a front surface wiring which is formed so as to surround the gate wiring electrode 42 including the gate wiring 42*w*. Further, in the MOSFET 202 shown in FIG. 16, though the gate wiring 42*w* is opened in a plan view and the source wiring 41*w* and the source pad 41*p* are directly connected to each other in the opening portion of the gate wiring 42*w*, there may be a structure where the source wiring 41*w* and the source pad 41*p* are separated from each other and electrically connected to each other through a conductive film which is provided, other than the source electrode 41, the gate wiring electrode 42, or the gate electrode 13, or electrically connected to each other through the terminal contact region 29.

In the MOSFET 202, the moisture-resistant insulating film 7 rides onto the source electrode 41, the gate wiring electrode 42, and the outer peripheral electrode 5 and covers an outer side end of the source pad 41*p*, an inner peripheral end and an outer peripheral end of the source wiring 41*w*, the inner peripheral end and the outer peripheral end of the gate wiring electrode 42, and the inner peripheral end of the outer peripheral electrode 5. It is preferable that the moisture-resistant insulating film 7 should cover the entire circumference of the inner peripheral end and the outer peripheral end of the source wiring 41*w* in a plan view.

Further, the moisture-resistant insulating film 7 is provided with openings above the source electrode 41, the outer peripheral electrode 5, and the gate wiring electrode 42. The opening above the source electrode 41 is provided above both the source wiring 41*w* and the source pad 41*p*. The opening above the gate wiring electrode 42 is provided above the gate pad 42*p* but not provided above the gate wiring 42*w*, and the gate wiring 42*w* is completely covered with the moisture-resistant insulating film 7.

Furthermore, the semi-insulating film 8 is formed so as to cover the moisture-resistant insulating film 7 and connected to the source wiring 41*w* and the outer peripheral electrode S in the opening portions of the moisture-resistant insulating film 7. Further, the semi-insulating film 8 is not connected to the source pad 41*p* or the gate pad 42*p*.

[Operation]

An operation of the MOSFET 200 in accordance with the second preferred embodiment shown in FIG. 11 will be described on two states separately.

A first state is a state where a positive voltage having a threshold value or more is applied to the gate electrode 13. Hereinafter, this state will be referred to as an “ON state”, In the ON state, the inversion channel is formed in the channel region. The inversion channel is a path in which electrons as a carrier flow between the source region 15 and the drift layer 1. In the ON state, when a high voltage is applied to the back surface electrode 11, with the source electrode 41 as a reference, currents flow in the single crystal substrate 31 and the drift layer 1. A voltage between the source electrode 41 and the back surface electrode 11 at that time is referred to as an ON-state voltage and a current flows between the source electrode 41 and the back surface electrode 11 is referred to as an ON-state current. The ON-state currents flow only in the inner region RI in which a channel exists and do not flow in the outer region RO.

A second state is a state where a voltage having less than the threshold value is applied to the gate electrode 13. Hereinafter, this state will be referred to as an “OFF state”. In the OFF state, since the inversion channel is not formed in the channel region, no ON-state current flows. Therefore, when a high voltage is applied between the source electrode 41 and the back surface electrode 11, this high voltage is maintained. At that time, since a voltage between the gate electrode 13 and the source electrode 41 is very low relative to the voltage between the source electrode 41 and the back surface electrode 11, a high voltage is applied between the gate electrode 13 and the back surface electrode 11.

Also in the outer region RO, a high voltage is applied between each of the gate wiring electrode 42 and the gate electrode 13, and the back surface electrode 11. Just as an electrical contact between the device well region 9 and the source electrode 41 is formed in the inner region RI, since an electrical contact between the terminal contact region 29 and the source electrode 41 is formed in the outer region RO, it is possible to prevent a high electric field from being applied to the gate insulating film 12 and the interlayer insulating film 14.

The outer region RO in the OFF state performs an operation similar to that of the SBD 100 in the OFF state which is described in the first preferred embodiment. Specifically, when a high electric field is applied in the vicinity of the pn junction interface between the drift layer 1 and the terminal well region 20 and a voltage exceeding the critical electric field is applied to the back surface electrode 11, the avalanche breakdown occurs. Normally, the rated voltage is determined so that the MOSFET 200 can be used in a range in which the avalanche breakdown does not occur.

In the OFF state, a depletion layer is spread in a direction (downward direction) from the pn junction interface between the drift layer 1, and the device well region 9 and the terminal well region 20 toward the single crystal substrate 31 and an outer peripheral direction (rightward direction) of the drift layer 1.

Herein, considered is a case where the MOSFET 200 is brought into the OFF state under high humidity conditions. In a case where the surface protection film 10 is formed of polyimide or the like, the surface protection film 10 contains much moisture under high humidity conditions. When this moisture reaches the surfaces of the source electrode 41, the gate wiring electrode 42, and the outer peripheral electrode 5, the source electrode 41 and the gate wiring electrode 42 act as a cathode and the outer peripheral electrode 5 acts as an anode by the voltage applied to the MOSFET 200 in the OFF state. Also in a case where no surface protection film 10 is not formed, much moisture permeates the sealing gel and reaches the MOSFET 200, and similarly the source electrode 41 and the gate wiring electrode 42 act as the cathode and the outer peripheral electrode S acts as the anode. Further, in a case where a voltage not higher than that of the source electrode 41 is applied to the gate electrode 13, a relation in which the gate wiring electrode 42 acts as the cathode and the source electrode 41 acts as the anode is also satisfied.

In the vicinity of the source electrode 41 and the gate wiring electrode 42 acting as the cathode, the reduction reaction of oxygen and the production reaction of hydrogen occur, which are described in the first preferred embodiment. With these reactions, the concentration of hydroxide ions in the vicinity of the source electrode 41 and the gate wiring electrode 42 increases. The hydroxide ions chemically react with the source electrode 41 and the gate wiring electrode 42. In a case where the source electrode 41 and the gate wiring electrode 42 are each formed of aluminum, for example, by the above-described chemical reactions, aluminum sometimes becomes aluminum hydroxide. Further, aluminum hydroxide sometimes becomes aluminum oxide, depending on the ambient temperature, pH, and the like Furthermore, in the case where the front surface electrode 4 is formed of aluminum, for example, in the vicinity of the outer peripheral electrode 5 acting as the anode, aluminum becomes $Al^{3+}$ and is dissolved, and then reacts with the ambient moisture to become aluminum hydroxide or aluminum oxide.

In a case where a relation is satisfied, where the gate wiring electrode 42 acts as the cathode and the source electrode 41 acts as the anode, or also another case where the inverse relation is satisfied, these reactions occur in accordance with the polarity in the same manner.

This aluminum hydroxide or aluminum oxide is deposited as the insulating material on the surfaces of the source electrode 41, the gate wiring electrode 42, and the outer peripheral electrode 5. With this deposition, when films on the source electrode 41, the gate wiring electrode 42, and the outer peripheral electrode 5 are broken or pushed up, to be thereby removed, and the removal develops to form a cavity portion in an upper portion of the field insulating film 3 and the interlayer insulating film 14, moisture enters the cavity portion. This moisture entering the cavity portion causes excessive leakage currents or causes air discharge in the cavity portion, and this can become a cause of element destruction of the MOSFET 200. Further, when volume expansion occurs by the deposition of the insulating material, a stress is applied to the film and the epitaxial substrate 30 below the source electrode 41, the gate wiring electrode 42, and the outer peripheral electrode 5, to thereby cause physical destruction of the MOSFET 200, which can become a cause of element destruction.

The above-described deposition reaction of aluminum hydroxide or aluminum oxide is accelerated by the electric field strength. Especially, the outer peripheral end portion of the gate wiring electrode 42 and the inner peripheral end portion of the outer peripheral electrode 5 easily become a high electric field, and further in a case where the epitaxial substrate 30 is formed of silicon carbide, the drift layer 1 becomes a high concentration and therefore the electric field strength becomes much higher, and the deposition reaction of aluminum hydroxide or aluminum oxide is accelerated. Further, the outer peripheral end portion of the source electrode 41 and the inner peripheral end portion of the gate wiring electrode 42 also become a high electric field by the voltage applied to the gate wiring electrode 42, and the deposition reaction of aluminum hydroxide or aluminum oxide is accelerated.

Furthermore, in a case where the semi-insulating film 8 is connected to the end portions of the source electrode 41, the gate wiring electrode 42, and the outer peripheral electrode 5, the moisture reaches the end portions of the source electrode 41, the gate wiring electrode 42, and the outer peripheral electrode 5 through the semi-insulating film 8 and electrons are exchanged among the source electrode 41, the gate wiring electrode 42, and the outer peripheral electrode 5 through the semi-insulating film 8, and the deposition reaction of aluminum hydroxide or aluminum oxide is thereby further accelerated. Furthermore, with the conductivity of the semi-insulating film 8, a potential gradient easily occurs around the end portions of the source electrode 41 and the gate wiring electrode 42 and the inner peripheral end portion of the outer peripheral electrode 5 and there is a possibility that the deposition reaction of aluminum hydroxide or aluminum oxide may be accelerated by the electric field strength.

Further, the voltage applied to the gate wiring electrode 42 is constantly changed during the operation of the MOSFET 200, and the gate wiring electrode 42 repeatedly becomes the anode or a negative electrode with respect to the source electrode 41. At that time, the electrons go back and forth between the source electrode 41 and the gate wiring electrode 42, and there is a possibility that the deposition reaction of aluminum hydroxide or aluminum oxide may be accelerated in accordance with the speed.

In contrast to this, in the MOSFET 200 of the second preferred embodiment, the moisture-resistant insulating film 7 completely covers the gate wiring 42*w* and covers an outer end surface of the source electrode 41 and the inner end surface of the outer peripheral electrode 5. Further, the moisture-resistant insulating film 7 covers an outer end surface and an inner end surface of the gate pad 42*p*. It is therefore possible to prevent the moisture from reaching the outer peripheral end portions of the gate wiring electrode 42 and the source electrode 41 and the inner peripheral end portion of the outer peripheral electrode 5 where aluminum hydroxide or aluminum oxide is especially easily deposited. As a result, it is possible to suppress deposition of aluminum hydroxide or aluminum oxide.

Further, in the MOSFET 200, the semi-insulating film 8 is connected to the source electrode 41 and the outer peripheral electrode 5 through the opening portions of the moisture-resistant insulating film 7 and is not connected to the gate wiring electrode 42. For this reason, a gentle potential gradient which is not affected by the potential of the gate wiring electrode 42 is formed from the source electrode 41 to the outer peripheral electrode 5. It is thereby possible to suppress occurrence of excessive electric field concentration around the terminal well region 2.

The above effects can be produced also in the MOSFETs 201 and 202 described in the first and second variations of the second preferred embodiment.

In the MOSFET 201 shown in FIG. 14, the gate wiring 42*w* does not surround the source electrode 41 and is formed so as to enter the recessed portion on one side of the rectangular source electrode 41 in a plan view. Even in such a case, the moisture-resistant insulating film 7 covers the end portion of the gate pad 42*p*, completely covers the gate wiring 42*w*, and covers the outer peripheral end of the source electrode 41 and the inner peripheral end of the outer peripheral electrode 5. For this reason, the moisture is hard to reach the gate wiring electrode 42, the outer peripheral end portion of the source electrode 41, and the inner peripheral end portion of the outer peripheral electrode 5 in which especially aluminum hydroxide or aluminum oxide is easily deposited, and it is thereby possible to suppress deposition of aluminum hydroxide or aluminum oxide.

Further, also in the MOSFET 201, the semi-insulating film 8 is connected to the source electrode 41 and the outer peripheral electrode 5 through the openings of the moisture-resistant insulating film 7 and is not connected to the gate wiring electrode 42. For this reason, a gentle potential gradient which is not affected by the potential of the gate wiring electrode 42 is formed from the source electrode 41 to the outer peripheral electrode 5. It is thereby possible to suppress occurrence of excessive electric field concentration around the terminal well region 2.

In the MOSFET 202 shown in FIG. 15, the source wiring 41*w* is formed so as to surround the gate wiring electrode 42. Even in such a case, the MOSFET 202 has a structure where the moisture-resistant insulating film 7 covers the outer end surface of the source pad 41*p*, the inner peripheral end and the outer peripheral end of the source wiring 41*w*, the inner end surface of the outer peripheral electrode 5, and the inner peripheral end and the outer peripheral end of the gate wiring electrode 42. For this reason, the moisture is hard to reach the gate wiring electrode 42, the outer peripheral end portion of the source electrode 41, and the inner peripheral end portion of the outer peripheral electrode 5 in which especially aluminum hydroxide or aluminum oxide is easily deposited, and it is thereby possible to suppress deposition of aluminum hydroxide or aluminum oxide.

Further, also in the MOSFET 202, the semi-insulating film 8 is connected to the source wiring 41*w* and the outer peripheral electrode 5 through the opening portions of the moisture-resistant insulating film 7 and is not connected to the gate wiring electrode 42. For this reason, a gentle potential gradient which is not affected by the potential of the gate wiring electrode 42 is formed from the source wiring 41*w* to the outer peripheral electrode 5. It is thereby possible to suppress occurrence of excessive electric field concentration around the terminal well region 2.

[Manufacturing Method]

Next, a method of manufacturing the MOSFET 200 in accordance with the second preferred embodiment will be described.

First, prepared is the single crystal substrate 31 having a low resistance which contains n-type impurities at a relatively high concentration ($n^+$), like in the first preferred embodiment. The single crystal substrate 31 is a SiC substrate of 4H polytype and has an off angle of 4 or 8 degrees.

Next, epitaxial growth of SiC is performed on the single crystal substrate 31, to thereby form the n-type epitaxial layer 32 having an impurity concentration not lower than $1\times10^{14}/cm^3$ and not higher than $1\times10^{17}/cm^3$. As a result, the epitaxial substrate 30 consisting of the single crystal substrate 31 and the epitaxial layer 32 is obtained.

Next, by combining the formation of the resist mask in the photolithography process and the ion implantation process using the resist mask as the implantation mask to repeat a process of forming an impurity region on the upper layer portion of the epitaxial layer 32, the terminal well region 20, the device well region 9, the contact region 19, the source region 15, the terminal contact region 29, and the outer peripheral contact region 25 are formed on the upper layer portion of the epitaxial layer 32.

In the ion implantation, N (nitrogen) or the like is used as the n-type impurity and Al, B, or the like is used as the p-type impurity. The device well region 9, the terminal well region 20, and the high concentration region 21 can be formed by one operation. Further, the contact region 19 and the terminal contact region 29 can be formed by one operation. The source region 15 and the outer peripheral contact region 25 can be formed by one operation. Furthermore, the terminal contact region 29 may be formed together with the source region 15 by one operation. The outer peripheral contact region 25 may be formed together with the contact region 19 by one operation.

It is assumed that the device well region 9 and the high concentration region 21 of the terminal well region 20 each have an impurity concentration not lower than $1.0\times10^{18}/cm^3$ and not higher than $1.0\times10^{20}/cm^3$. The impurity concentration of the source region 15 is assumed to be not lower than $1.0\times10^{19}/cm^3$ and not higher than $1.0\times10^{21}/cm^3$ and to be higher than that of the device well region 9. The dose amount in the low concentration region 22 is preferably not lower than $0.5\times10^{13}/cm^2$ and not higher than $5\times10^{13}/cm^2$, and for example, $1.0\times10^{13}/cm^2$. The impurity concentration of the contact region, the terminal contact region 29, and the outer peripheral contact region 25 is made higher than that of the device well region 9.

In a case of using Al, the implantation energy of the ion implantation is, for example, not lower than 100 keV and not higher than 700 keV. In this case, the impurity concentration of the low concentration region 22 converted from the above-described dose amount [$cm^2$] is not lower than $1\times10^{17}/cm^3$ and not higher than $1\times10^{19}/cm^3$. Further, in a case of using N, the implantation energy of the ion implantation is, for example, not lower than 20 keV and not higher than 300 keV.

After that, annealing is performed by using the heat treatment apparatus at a temperature not lower than 1300° C. and not higher than 1900° C. in an atmosphere of an inert gas such as argon (Ar) gas or the like for not shorter than 30 seconds and not longer than 1 hour. By this annealing, the impurities added by the ion implantation are activated.

Next, for example, by the CVD method, a $SiO_2$ film having a thickness of 1 μm which is to become the field insulating film 3 is deposited on a surface of the epitaxial substrate 30. After that, in the photolithography process and the etching process, patterning of the $SiO_2$ film is performed so that the $SiO_2$ film in the inner region RI, a partial region on the high concentration region 21 in the outer region RO, and a region to connect the outer peripheral electrode 5 to the epitaxial substrate 30 can be removed. The field insulating film 3 is thereby formed on the front surface S2 of the epitaxial substrate 30.

Subsequently, by thermally oxidizing the front surface S2 of the epitaxial layer 32 which is not covered with the field insulating film 3, $SiO_2$ which is to become the gate insulating film 12 is formed. Then, a polycrystalline silicon film having conductivity, which is to become the gate electrode 13, is formed by the low pressure CVD method. Further, in the photolithography process and the etching process, patterning of the polycrystalline silicon film is performed, to thereby form the gate electrode 13.

Next, a $SiO_2$ film which is to become the interlayer insulating film 14 is formed by the CVD method. Then, in the photolithography process and the etching process, formed is a contact hole penetrating $SiO_2$ to reach each of the contact region 19 and the source region 15. At the same time, in the outer region RO, formed is a contact hole penetrating the interlayer insulating film 14 to reach the gate electrode 13. Further, the $SiO_2$ film is removed from on the field insulating film 3 and from the outer peripheral portion of the epitaxial layer 32.

There may be a structure where the interlayer insulating film 14 rides onto the field insulating film 3. Further, the opening provided in the field insulating film 3 to connect the outer peripheral electrode 5 to the epitaxial substrate 30 may be formed in the patterning of the interlayer insulating film 14. Furthermore, the field insulating film 3 and the interlayer insulating film 14 may be formed in the same process, to be an integral film.

Next, a material layer which is to become the source electrode 41, the gate wiring electrode 42, and the outer peripheral electrode 5 is formed on the front surface S2 of the epitaxial substrate 30 by the sputtering method, the vapor deposition method, or the like, and patterning of the material layer is performed in the photolithography process and the etching process. As the material layer which is to become the source electrode 41, the gate wiring electrode 42, and the outer peripheral electrode 5, for example, a metal containing any one or more of Ti, Ni, Al, Cu, and Au, an Al alloy such as Al—Si, or the like can be used. In a portion of the epitaxial substrate 30, which is in contact with such a material layer, a silicide film may be formed by the heat treatment in advance.

Next, for example, by the plasma CVD method, a SiN film which is to become the moisture-resistant insulating film 7 is formed. After that, in the photolithography process and the etching process, by removing the SiN film in a region where the semi-insulating film 8 is connected to the source electrode 41 and the outer peripheral electrode 5 and in a region on which wire bonding, dicing, and the like are performed, the moisture-resistant insulating film 7 having openings in these regions is formed.

Next, for example, by the plasma CVD method, a SInSiN film which is to become the semi-insulating film 8 is formed. After that, in the photolithography process and the etching process, by removing the SInSiN film in a region on which wire bonding, dicing, and the like are performed, the semi-insulating film 8 having openings in the regions is formed.

The removal of the SiN film and the SInSiN film in the region on which wire bonding, dicing, and the like are performed may be performed in the same etching process. Further, in the formation of the semi-insulating film 8, the semi-insulating film 8 may have a multilayer structure by forming the SiN film having high moisture resistance and insulating properties on the SInSiN film.

Next, for example, photosensitive polyimide is applied so as to cover the source electrode 41, the gate wiring electrode 42, the outer peripheral electrode 5, the field insulating film 3, the interlayer insulating film 14, the moisture-resistant insulating film 7, the semi-insulating film 8, and the front surface S2 of the epitaxial substrate 30, and the surface protection film 10 having a predetermined pattern is formed in the photolithography process. Further, in a case where the MOSFET 200 is used, being covered with the scaling gel having a low elastic modulus, such as silicone gel or the like, the formation of the surface protection film 10 may be omitted.

After that, for example, by the sputtering method, the back surface electrode 11 is formed on the back surface S1 of the epitaxial substrate 30, to thereby obtain the structure of the MOSFET 200 shown in FIG. 11.

Further, the formation of the back surface electrode 11 may be performed before or after the process of forming the source electrode 41, the gate wiring electrode 42 and the outer peripheral electrode 5. As the material of the back surface electrode 11, a metal containing one or more of Ti, Ni, Al, Cu, and Au, or the like can be used. The thickness of the back surface electrode 11 is preferably not smaller than 50 nm and not larger than 2 μm, and for example, the back surface electrode 11 may be formed of a double-layer film (Ti/Au) of Ti and Au each having a thickness not larger than 1 μm.

[Summary]

According to the structures of the second preferred embodiment and the variations thereof, it is possible to suppress the insulating material from being deposited to the end portions of the source electrode 41, the gate wiring electrode 42, and the outer peripheral electrode 5. Further, the potential gradient in the terminal region is made gentle and excessive electric field concentration is suppressed, and it is thereby possible to increase the insulation reliability of the MOSFET.

The Third Preferred Embodiment

In the third preferred embodiment, an exemplary case will be shown where the semiconductor device in accordance with the above-described first and second preferred embodiments is applied to a power converter. Herein, an exemplary case where the semiconductor device in accordance with the first and second preferred embodiments is applied to a three-phase inverter as the power converter will be described.

FIG. 17 is a block diagram schematically showing a configuration of a power conversion system to which a power converter 2000 in accordance with the third preferred embodiment is applied.

The power conversion system shown in FIG. 17 has a power supply 1000, a power converter 2000, and a load 3000. The power supply 1000 is a DC power supply and supplies direct current (DC) power to the power converter 2000. The power supply 1000 can be formed of various constituent elements, and for example, can be formed of a DC system, a solar battery, or a storage battery, or may be formed of a rectifier circuit connected to an AC system, or an AC/DC converter. Further, the power supply 1000 may be formed of a DC/DC converter which converts the direct current power outputted from the DC system into predetermined electric power.

The power converter 2000 is a three-phase inverter which is connected between the power supply 1000 and the load 3000, and converts the direct current power suppled from the power supply 1000 into alternating current (AC) power and supplies the alternating current power to the load 3000. As shown in FIG. 17, the power converter 2000 has a main conversion circuit 2001 for converting the direct current power into the alternating current power and outputting the alternating current power, a drive circuit 2002 for outputting a drive signal used for driving a switching element of the main conversion circuit 2001, and a control circuit 2003 for outputting a control signal used for controlling the drive circuit 2002.

The load 3000 is a three-phase electric motor which is driven by the alternating current power supplied from the power converter 2000. Further, the load 3000 is not limited to a specific use but is an electric motor mounted on any one of various electric equipments, and is used as, for example, an electric motor for a hybrid vehicle, an electric vehicle, a railway vehicle, an elevator, or an air conditioner.

Hereinafter, details of the power converter 2000 will be described. The main conversion circuit 2001 has a switching element and a reflux diode (not shown), and when the switching element performs a switching operation, the main conversion circuit 2001 converts the direct current power supplied from the power supply 1000 into the alternating current power and supplies the alternating current power to the load 3000. A specific circuit configuration of the main conversion circuit 2001 may be any one of various configurations, and the main conversion circuit 2001 in accordance with the present preferred embodiment is a two-level three-phase full-bridge circuit and can be constituted of six switching elements and six reflux diodes which are connected in inverse parallel to the switching elements, respectively. The above-described semiconductor device in accordance with the first or second preferred embodiment is applied to at least any one of the six switching elements and the six reflux diodes of the main conversion circuit 2001. The six switching elements form (three) upper and lower arms in each of which two switching elements are connected in series to each other, and the upper and lower arms form three phases (U-phase, V-phase, and W-phase) of the full-bridge circuit, respectively. Then, respective output terminals of the upper and lower arms, i.e., three output terminals of the main conversion circuit 2001 are connected to the load 3000.

The drive circuit 2002 generates the drive signal used for driving the switching element of the main conversion circuit 2001 and supplies the drive signal to a control electrode of the switching element of the main conversion circuit 2001. Specifically, in response to the control signal from the control circuit 2003 described later, the drive circuit 2002 outputs a drive signal for bringing the switching element into an On state and another drive signal for bringing the switching element into an OFF state to the control electrode of each switching element. In a case of keeping the switching element in the ON state, the drive signal is a voltage signal (ON signal) having a voltage higher than a threshold voltage of the switching element, and in a case of keeping the switching element in the OFF state, the drive signal is a voltage signal (OFF signal) having a voltage lower than the threshold voltage of the switching element.

The control circuit 2003 controls the switching element of the main conversion circuit 2001 so that desired electric power may be supplied to the load 3000. Specifically, the control circuit 2003 calculates a time (ON time) when each switching element of the main conversion circuit 2001 comes into the ON state, on the basis of the electric power to be supplied to the load 3000. For example, the main conversion circuit 2001 can be controlled by the pulse wide modulation (PWM) control in which the ON time of the switching element is modulated in accordance with the voltage to be outputted. Then, at each point in time, the control circuit 2003 outputs a control command (control signal) to the drive circuit 2002 so as to output the ON signal to the switching element to be brought into the ON state and output the OFF signal to the switching element to be brought into the OFF state. In response to this control signal, the drive circuit 2002 outputs the ON signal or the OFF signal as the drive signal to the control electrode of each switching element.

In the power converter in accordance with the present preferred embodiment, the semiconductor device of the first preferred embodiment can be applied as the reflux diode of the main conversion circuit 2001 and the semiconductor device of the second preferred embodiment can be applied as the switching element thereof. Further, in a case where the semiconductor devices of the first and second preferred embodiments are thus applied to the power converter 2000, normally, these devices are used, being embedded in gel, a resin, or the like but these materials cannot completely block moisture, and therefore with the configurations shown in the first and second preferred embodiments, the insulation protection of the semiconductor device can be maintained. It is thereby possible to achieve an increase in the reliability.

Though the exemplary case where the power converter to which the semiconductor device in accordance with the first and second preferred embodiments is applied is the two-level three-phase inverter has been described in the present preferred embodiment, the semiconductor device in accordance with the first and second preferred embodiments can be applied to any one of various power converters. The power converter may be, for example, a multilevel power converter such as a three-level one or the like. In a case of supplying electric power to a single phase load, the power converter may be a single phase inverter. In a case of supplying electric power to a DC load or the like, the power converter may be the DC/DC converter or the AC/DC converter.

Further, the power converter to which the semiconductor device in accordance with the first and second preferred embodiments is applied is not limited to the exemplary case where the load is an electric motor, but can be used as, for example, a power supply device used for any one of an electrical discharge machine, a laser processing machine, an induction heating cooker, and a non-contact power supply system and further can be used as a power conditioner of a photovoltaic (PV) power generation system, a power storage system, or the like.

Further, the preferred embodiments may be freely combined, or may be changed or omitted as appropriate.

The foregoing description is in all aspects illustrative, and it is therefore understood that numerous modifications and variations can be devised. For example, any constituent element can be deformed, added, and/or omitted, and at least one constituent element in at least one preferred embodiment can be extracted and combined with a constituent element in any other preferred embodiment.

When each of the above-described preferred embodiments describes that "one" constituent element is included, "one or more" constituent elements may be included, as long as no contradiction arises. Further, each of the constituent elements constituting the technique in accordance with the present disclosure is a conceptual unit, and one constituent element may include a plurality of structures and one constituent element may be part of a structure. Furthermore, each of the constituent elements constituting the technique in accordance with the present disclosure includes a structure having any other structure or shape, as long as the same function can be performed.

EXPLANATION OF REFERENCE SIGNS

1 drift layer, 2 terminal well region, 3 field insulating film, 4 front surface electrode, 5 outer peripheral electrode, 6 auxiliary electrode, 7 moisture-resistant insulating film, 8 semi-insulating film, 9 device well region, 10 surface protection film, 11 back surface electrode, 12 gate insulating film, 13 gate electrode, 14 interlayer insulating film, 15 source region, 19 contact region, 20 terminal well region, 21 high concentration region, 22 low concentration region, 25 outer peripheral contact region, 29 terminal contact region, 30 epitaxial substrate, 31 single crystal substrate, 32 epitaxial layer, 41 source electrode, 41*p* source pad, 41*w* source wiring, 42 gate wiring electrode, 42*p* gate pad, 42*w* gate wiring, 100 to 104 SBD, 200 to 201 MOSFET, S1 back surface of epitaxial substrate, S2 front surface of epitaxial substrate, UC unit cell, RI inner region, RO outer region, 1000 power supply, 2000 power converter, 2001 main conversion circuit, 2002 drive circuit, 2003 control circuit, 3000 load

The invention claimed is:

1. A semiconductor device, comprising:

a semiconductor layer of a first conductivity type;

a field insulating film formed on a front surface of the semiconductor layer;

a front surface electrode formed on the front surface of the semiconductor layer on an inner side with respect to the field insulating film, riding onto an inner peripheral end of the field insulating film;

an outer peripheral electrode formed on the front surface of the semiconductor layer on an outer side with respect to the field insulating film, riding onto an outer peripheral end of the field insulating film;

a well region of a second conductivity type formed in a surface portion of the semiconductor layer and connected to the front surface electrode, extending up to an outer side with respect to an outer peripheral end of the front surface electrode;

a moisture-resistant insulating film which is formed so as to cover the outer peripheral end of the front surface electrode, an inner peripheral end of the outer peripheral electrode, and the field insulating film;

a semi-insulating film formed on the moisture-resistant insulating film and connected to the front surface electrode and the outer peripheral electrode which are exposed from the moisture-resistant insulating film; and a back surface electrode formed on a back surface side of the semiconductor layer.

2. A semiconductor device, comprising:

a semiconductor layer of a first conductivity type;

a field insulating film formed on a front surface of the semiconductor layer;

an interlayer insulating film formed on the front surface of the semiconductor layer on an inner side with respect to the field insulating film;

a front surface electrode formed on the front surface of the semiconductor layer, riding onto the interlayer insulating film;

a control wiring electrode formed on the interlayer insulating film on an outer side with respect to the front surface electrode, being separated from the front surface electrode;

an outer peripheral electrode formed on the front surface of the semiconductor layer on an outer side with respect to the field insulating film, riding onto an outer peripheral end of the field insulating film;

a well region of a second conductivity type formed in a surface portion of the semiconductor layer and connected to the front surface electrode, extending up to an outer side with respect to an outer peripheral end of the front surface electrode;

a moisture-resistant insulating film which is formed so as to cover the outer peripheral end of the front surface electrode, an inner peripheral end of the outer peripheral electrode, an inner peripheral end and an outer peripheral end of the control wiring electrode, and the field insulating film;

a semi-insulating film formed on the moisture-resistant insulating film and connected to the front surface electrode and the outer peripheral electrode which are exposed from the moisture-resistant insulating film; and a back surface electrode formed on a back surface side of the semiconductor layer.

3. The semiconductor device according to claim 1, wherein the moisture-resistant insulating film covers an entire circumference of the outer peripheral end of the front surface electrode and an entire circumference of the inner peripheral end of the outer peripheral electrode in a plan view.

4. The semiconductor device according to claim 2, wherein the moisture-resistant insulating film covers an entire circumference of the outer peripheral end of the front surface electrode, an entire circumference of the inner peripheral end of the outer peripheral electrode, and entire circumferences of the inner peripheral end and the outer peripheral end of the control wiring electrode in a plan view.

5. The semiconductor device according to claim 2, wherein the control wiring electrode includes a control wiring which is formed so as to surround the front surface electrode, and the moisture-resistant insulating film covers the entire control wiring.

6. The semiconductor device according to claim 5, wherein the moisture-resistant insulating film covers entire circumferences of an inner peripheral end and an outer peripheral end of the control wiring in a plan view.

7. The semiconductor device according to claim 5, wherein the front surface electrode includes a front surface wiring which is formed so as to surround the control wiring electrode including the control wiring, the moisture-resistant insulating film covers an inner peripheral end and an outer peripheral end of the front surface wiring and has an opening on the front surface wiring, and the semi-insulating film is connected to the front surface wiring through the opening of the moisture-resistant insulating film.

8. The semiconductor device according to claim 7, wherein the moisture-resistant insulating film covers entire circumferences of the inner peripheral end and the outer peripheral end of the front surface wiring in a plan view.

9. The semiconductor device according to claim 1, wherein the moisture-resistant insulating film is formed of silicon nitride.

10. The semiconductor device according to claim 2, wherein the moisture-resistant insulating film is formed of silicon nitride.

11. The semiconductor device according to claim 1, wherein the moisture-resistant insulating film has an opening used for connecting the semi-insulating film to the front surface electrode or the outer peripheral electrode, between an inner peripheral end and an outer peripheral end of the moisture-resistant insulating film.

12. The semiconductor device according to claim 2, wherein the moisture-resistant insulating film has an opening used for connecting the semi-insulating film to the front surface electrode or the outer peripheral electrode, between an inner peripheral end and an outer peripheral end of the moisture-resistant insulating film.

13. The semiconductor device according to claim 1, wherein the well region is formed, being divided into a plurality of well regions, the semiconductor device further comprising:

a plurality of auxiliary electrodes connected to the plurality of well regions, respectively, riding onto the field insulating film, wherein the semi-insulating film is connected to the plurality of auxiliary electrodes through openings formed in the moisture-resistant insulating film.

14. The semiconductor device according to claim 2, wherein the well region is formed, being divided into a plurality of well regions, the semiconductor device further comprising:

a plurality of auxiliary electrodes connected to the plurality of well regions, respectively, riding onto the field insulating film, wherein the semi-insulating film is connected to the plurality of auxiliary electrodes through openings formed in the moisture-resistant insulating film.

15. The semiconductor device according to claim 1, wherein the semi-insulating film is connected to the semiconductor layer including the well regions through openings formed in the field insulating film and the moisture-resistant insulating film.

16. The semiconductor device according to claim 2, wherein the semi-insulating film is connected to the semiconductor layer including the well regions through openings formed in the field insulating film and the moisture-resistant insulating film.

17. The semiconductor device according to claim 1, wherein the semiconductor layer is formed of wide bandgap semiconductor.

18. The semiconductor device according to claim 2, wherein the semiconductor layer is formed of wide bandgap semiconductor.

19. A power converter, comprising:

a conversion circuit having the semiconductor device according to claim 1, for converting inputted electric power and outputting converted electric power;

a drive circuit for outputting a drive signal used for driving the semiconductor device to the semiconductor device; and a control circuit for outputting a control signal used for controlling the drive circuit to the drive circuit.

20. A power converter, comprising:

a conversion circuit having the semiconductor device according to claim 2, for converting inputted electric power and outputting converted electric power;

a drive circuit for outputting a drive signal used for driving the semiconductor device to the semiconductor device; and a control circuit for outputting a control signal used for controlling the drive circuit to the drive circuit.

* * * * *